US008969905B2

(12) United States Patent
Okabe et al.

(10) Patent No.: US 8,969,905 B2

(45) Date of Patent: Mar. 3, 2015

(54) SEMICONDUCTOR LIGHT EMITTING DEVICE AND METHOD FOR MANUFACTURING SEMICONDUCTOR LIGHT EMITTING DEVICE, AND LAMP

(75) Inventors: Takehiko Okabe, Chiba (JP); Daisuke Hiraiwa, Ichihara (JP); Remi Ohba, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 233 days.

(21) Appl. No.: 13/141,849

(22) PCT Filed: Dec. 15, 2009

(86) PCT No.: PCT/JP2009/006886

§ 371 (c)(1),
(2), (4) Date: Jun. 23, 2011

(87) PCT Pub. No.: WO2010/073539

PCT Pub. Date: Jul. 1, 2010

(65) Prior Publication Data

US 2011/0255294 A1 Oct. 20, 2011

(30) Foreign Application Priority Data

Dec. 25, 2008 (JP) ................................ 2008-329977

(51) Int. Cl.
*H01L 33/38* (2010.01)
*H01L 33/40* (2010.01)
(Continued)

(52) U.S. Cl.
CPC ............... *H01L 33/405* (2013.01); *H01L 33/32* (2013.01); *H01L 33/42* (2013.01)
USPC ........................ 257/99; 257/E33.066; 434/42

(58) Field of Classification Search
CPC ...... H01L 33/42; H01L 33/405; H01L 33/387
USPC .......... 257/E33.055, E33.065, 98, 99; 438/42
See application file for complete search history.

(56) References Cited

U.S. PATENT DOCUMENTS

2005/0104080 A1* 5/2005 Ichihara et al. ................. 257/98
2005/0277218 A1* 12/2005 Nakajo et al. .................. 438/46

(Continued)

FOREIGN PATENT DOCUMENTS

JP 10-242516 A 9/1998
JP 10-242518 A 9/1998

(Continued)

OTHER PUBLICATIONS

Office Action with a mailing date of Dec. 25, 2012 for corresponding Taiwanese Application No. 098143668.

(Continued)

*Primary Examiner* — Marc Armand
*Assistant Examiner* — Sarah Salerno
(74) *Attorney, Agent, or Firm* — Sughrue Mion, PLLC

(57) ABSTRACT

A semiconductor light-emitting device (1) of the present invention includes: a substrate (101); a laminated semiconductor layer (20) containing a light-emitting layer, which is formed on the substrate (101); a first electrode (111) formed on the upper surface (106*c*) of the laminated semiconductor layer (20); and a second electrode (108) formed on an exposed surface (104*c*) that is formed by partially cutting the laminated semiconductor layer (20), wherein the first electrode (111) includes a transparent electrode (109) containing a hole portion (109*a*) through which the upper surface (106*c*) of the laminated semiconductor layer (20) is exposed, a junction layer (110) formed on a bottom surface (109*b*) and an inner wall (109*d*) of the hole portion (109*a*), and a bonding pad electrode (120) formed to cover the junction layer (110).

14 Claims, 13 Drawing Sheets

(51) Int. Cl.
*H01L 33/32* (2010.01)
*H01L 33/42* (2010.01)

(56) References Cited

U.S. PATENT DOCUMENTS

| | | | | |
|---|---|---|---|---|
| 2006/0124954 | A1* | 6/2006 | Akaishi | 257/99 |
| 2007/0090378 | A1* | 4/2007 | Lee et al. | 257/94 |
| 2008/0142821 | A1* | 6/2008 | Sakamoto et al. | 257/98 |
| 2009/0001407 | A1* | 1/2009 | Osawa et al. | 257/99 |
| 2009/0078951 | A1* | 3/2009 | Miki et al. | 257/98 |
| 2010/0072487 | A1* | 3/2010 | Tsai et al. | 257/86 |

FOREIGN PATENT DOCUMENTS

| | | | |
|---|---|---|---|
| JP | 2803742 | B2 | 9/1998 |
| JP | 2003-101071 | A | 4/2003 |
| JP | 2004-186543 | A | 7/2004 |
| JP | 2005-11857 | A | 1/2005 |
| JP | 2005-045038 | A | 2/2005 |
| JP | 2006-13034 | A | 1/2006 |
| JP | 2006-66903 | A | 3/2006 |
| JP | 2006-173506 | A | 6/2006 |
| JP | 2008-034822 | A | 2/2008 |
| JP | 2008-182050 | A | 8/2008 |
| JP | 2008-192710 | A | 8/2008 |
| JP | 2008-218440 | A | 9/2008 |

OTHER PUBLICATIONS

Japanese Office Action ("Decision of Rejection") with a mailing date of Sep. 3, 2013 for corresponding Japanese Patent Application No. 2008-329977.

* cited by examiner

SEMICONDUCTOR LIGHT EMITTING DEVICE AND METHOD FOR MANUFACTURING SEMICONDUCTOR LIGHT EMITTING DEVICE, AND LAMP

TECHNICAL FIELD

The present invention relates to a semiconductor light-emitting device, a production method of the semiconductor light-emitting device, and a lamp, and more particularly to a semiconductor light-emitting device that is excellent in a junction property of an electrode and light extraction efficiency, a production method thereof, and a lamp equipped therewith.

Priority is claimed on Japanese Patent Application No. 2008-329977, filed in the Japan Patent Office on Dec. 25, 2008, and the content of which is incorporated herein by reference.

BACKGROUND ART

Recently, as a semiconductor material for a short-wavelength light-emitting device, a GaN-based compound semiconductor has received attention. Generally, a GaN-based compound semiconductor is formed on a substrate made of sapphire monocrystals, various oxides, or group III-V compounds by using a thin film-forming means such as a metalorganic chemical vapor deposition (MOCVD) method or a molecular beam epitaxy (MBE) method.

A thin film made of a GaN-based compound semiconductor has the characteristic of small current diffusion in an in-plane direction of the thin film. Further, a p-type GaN-based compound semiconductor has the characteristic of a high resistivity in comparison to an n-type GaN-based compound semiconductor. Due to this, in the case where only a p-type electrode made of metal is laminated on the surface of the p-type GaN-based compound semiconductor layer, there is almost no spread of current in the in-plane direction of the p-type semiconductor layer. Accordingly, for example, if a laminated semiconductor layer having an LED structure comprised of an n-type semiconductor layer, a light-emitting layer, and a p-type semiconductor layer is formed as a semiconductor light-emitting device using the GaN-based compound semiconductor, and also a p-type electrode is formed on the p-type semiconductor layer of an uppermost portion, then only a portion of the light-emitting layer that is positioned just below the p-type electrode emits light.

As a method of extracting the emitted light, which occurs just below the p-type electrode, out of the semiconductor light-emitting device, there is a method of using the transparent p-type electrode, transmitting the light occurring just below this p-type electrode through the p-type electrode, and extract the light out of the semiconductor light-emitting device. As the transparent p-type electrode, a method is known that uses a conductive metal oxide such as ITO or a metal thin film of about several tens of nanometers.

For example, Patent Literature 1 discloses a method that uses a metal thin film of about several tens of nanometers. However, the transparent electrode comprised of metal oxide such as ITO or the ohmic electrode comprised of a metal thin film of about several tens of nanometers has a problem of a low strength of the electrode itself.

In order to improve the strength of the electrode itself, there is the example in which a bonding pad electrode, which is made of a metal material and has a specified thickness, is arranged on a transparent electrode made of metal oxide such as ITO or a p-type electrode made of a metal thin film of about several tens of nanometers. However, since this bonding pad electrode has no transparency and shields light, there was a problem in that it was not possible to extract light out of the semiconductor light-emitting device.

In order to solve this problem, for example, Patent Literature 2 discloses a method of laminating a bonding pad electrode formed of a reflection film, such as Ag, Al, on a p-type electrode. By forming the boding pad electrode from the reflection film, it is possible that the emitted light that has transmitted the p-type electrode is reflected to the inside of the light-emitting device by the bonding pad electrode and the reflected light is extracted from a portion other than a bonding pad electrode forming area to the outside of the light-emitting device.

CITATION LIST

Patent Literature

[Patent Literature 1]
Japanese Patent No. 2803742
[Patent Literature 2]
Japanese Unexamined Patent Application Publication No. 2006-66903

SUMMARY OF INVENTION

Technical Problem

However, when the boding pad electrode made of the reflection film such as Ag, Al is provided on the transparent electrode made of the metal oxide such as ITO, there was the problem in that the bonding pad electrode was peeled off from the transparent electrode by the tensile stress during bonding of the bonding wire to the boding pad electrode. Also, since the bonding pad electrode is peeled off from the transparent electrode, there was the problem in that the yield in manufacturing a lamp that uses such electrodes deteriorated.

The present invention has been made in view of the above-described problems, and an object of the invention is to provide a semiconductor light-emitting device that is excellent in a junction property, a production method thereof, and a lamp that is obtained by using the semiconductor light-emitting device, has good light extraction efficiency, and can be manufactured with good yield.

Solution to Problem

In order to achieve the above-described objects, the present invention adopts the following features.

(1) A semiconductor light-emitting device comprising:

a substrate;

a laminated semiconductor layer containing a light-emitting layer, which is formed on the substrate;

a first electrode formed on the upper surface of the laminated semiconductor layer; and a second electrode formed on an exposed surface that is formed by partially cutting the laminated semiconductor layer, wherein the first electrode includes a transparent electrode containing a hole portion through which the upper surface of the laminated semiconductor layer is exposed, a junction layer formed on a bottom surface and an inner wall of the hole portion, and a bonding pad electrode formed to cover the junction layer.

(2) A semiconductor light-emitting device according to (1), wherein a junction resistivity between the laminated semiconductor layer and the junction layer is higher than a junction resistivity between the transparent electrode and the junction layer.

(3) The semiconductor light-emitting device according to (1) or (2), wherein the junction layer is made of at least one kind of element selected from the group consisting of Al, Ti, V, Cr, Mn, Co, Zn, Ge, Zr, Nb, Mo, Ru, Hf, Ta, W, Re, Rh, Ir, and Ni, and is a thin film whose maximum thickness is within a range from 10 Å or more to 400 Å or less.

(4) The semiconductor light-emitting device according to any one of (1) to (3), wherein the bonding pad electrode is comprised of a bonding layer made of Au, Al, or an alloy comprising any one of these metals.

(5) The semiconductor light-emitting device according to (4), wherein the bonding pad electrode is comprised of a metal reflection layer formed to cover the junction layer and the bonding layer formed to cover the metal reflection layer, and the metal reflection layer is made of any one selected from the group consisting of Ag, Al, Ru, Rh, Pd, Os, Ir, Pt, and Ti or an alloy comprising any one of these metals.

(6) The semiconductor light-emitting device according to (1) to (5), wherein the transparent electrode is made of a transparent conductive material selected from the group consisting of zinc sulfide, chromium sulfide, and a conductive oxide comprising any one kind selected from the group consisting of In, Zn, Al, Ga, Ti, Bi, Mg, W, Ce, Sn, and Ni.

(7) The semiconductor light-emitting device according to (1) to (6), wherein the laminated semiconductor layer is mainly comprised of a gallium nitride semiconductor.

(8) The semiconductor light-emitting device according to (1) to (7), wherein the laminated semiconductor layer is formed by laminating in order an n-type semiconductor layer, the light-emitting layer, and a p-type semiconductor layer on the substrate, and the light-emitting layer has a multiple quantum well structure.

(9) A lamp comprising:

the semiconductor light-emitting device according to any one of (1) to (8);

a first frame on which the semiconductor light-emitting device is arranged and which is wire-bonded with the first electrode of the semiconductor light-emitting device;

a second frame which is wire-bonded with the second electrode of the semiconductor light-emitting device; and a mold formed around the semiconductor light-emitting device.

(10) A method of manufacturing a semiconductor light-emitting device which comprises a substrate; a laminated semiconductor layer containing a light-emitting layer, which is formed on the substrate; a first electrode formed on the upper surface of the laminated semiconductor layer; and a second electrode formed on an exposed surface that is formed by partially cutting the laminated semiconductor layer, the method comprising a first electrode manufacturing step which comprises the steps of:

forming a transparent electrode on the upper surface of the laminated semiconductor layer;

forming a hole portion of the transparent electrode, through which the upper surface of the laminated semiconductor layer is exposed;

forming a junction layer on a bottom surface and an inner wall of the hole portion; and forming a bonding pad electrode to cover the junction layer.

(11) An electronic appliance incorporated with the lamp according to (9).

(12) A mechanical device incorporated with the electronic appliance according to (11).

Advantageous Effects of Invention

In a semiconductor light-emitting device of the present invention that is formed to incorporate the junction layer in the hole portion of the transparent electrode, it is possible to obtain high junction strength between the junction layer, and the transparent electrode and the laminated semiconductor layer. In addition, since the boding pad electrode is formed to cover the junction layer, it is possible to obtain high junction strength between the junction layer and the boding pad electrode. Therefore, it is possible to obtain high junction strength between the boding pad electrode, and the transparent electrode and the laminated semiconductor layer. Also, it is possible to obtain a semiconductor light-emitting device that has the first electrode with a good junction property.

Also, a lamp according to the present invention is provided with a semiconductor light-emitting device according to the present invention which includes electrodes excellent in a junction property, and therefore, it can be manufactured with good yield.

Also, in a production method of a semiconductor light-emitting device of the present invention, a first electrode formation step comprises the steps of: forming a transparent electrode on the upper surface of the laminated semiconductor layer; forming a hole portion of the transparent electrode, through which the upper surface of the laminated semiconductor layer is exposed; forming a junction layer on a bottom surface and an inner wall of the hole portion; and forming a bonding pad electrode to cover the junction layer. Therefore, it is possible to easily produce a semiconductor light-emitting device of the present invention which has the first electrode with a good junction property.

DESCRIPTION OF EMBODIMENTS

Figure 1:
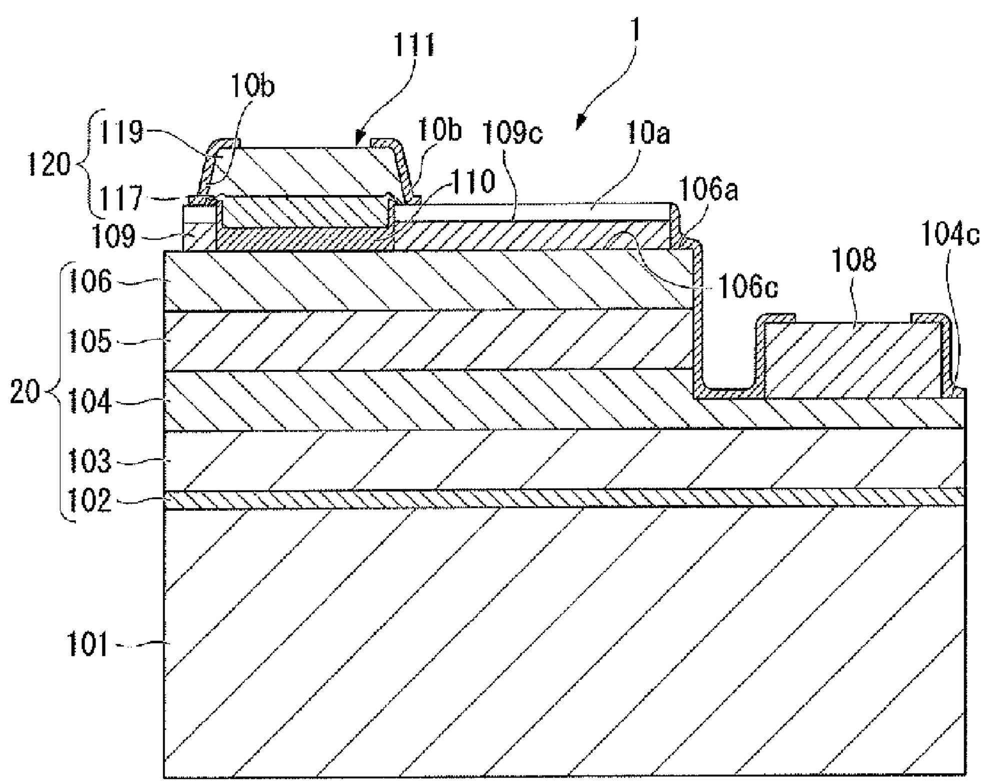
FIG. 1 is a view illustrating an example of a semiconductor light-emitting device of the present invention, and a schematic cross-sectional view of a semiconductor light-emitting device.

Hereinafter, the present invention will be described in detail using the accompanying drawings. In the following description of the present invention, the size, thickness, and dimensions of each portion as illustrated in the drawings referred to may be different from the actual relationship of the measurements of the semiconductor light-emitting device and the like.

Embodiment 1 Semiconductor Light-Emitting Device

Figure 2:
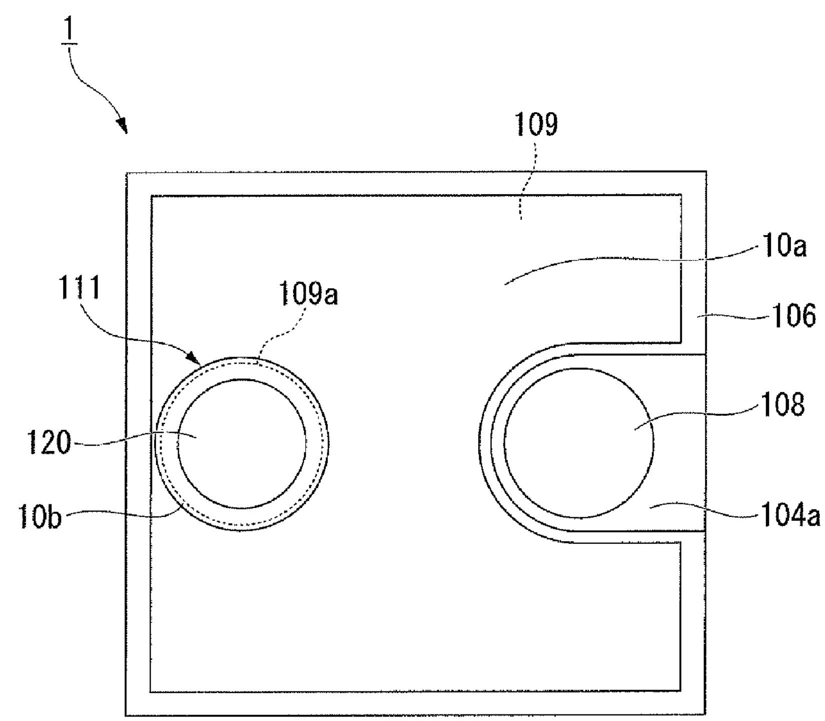
FIG. 2 is a schematic plan view of a semiconductor light-emitting device illustrated in FIG. 1.
Figure 3:
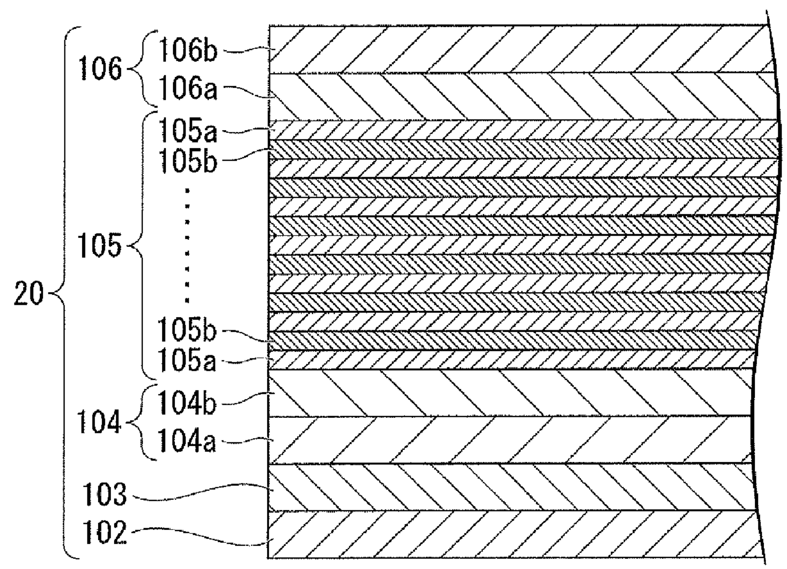
FIG. 3 is an enlarged schematic cross-sectional view of a laminated semiconductor layer constituting a semiconductor light-emitting device illustrated in FIG. 1.
Figure 4:
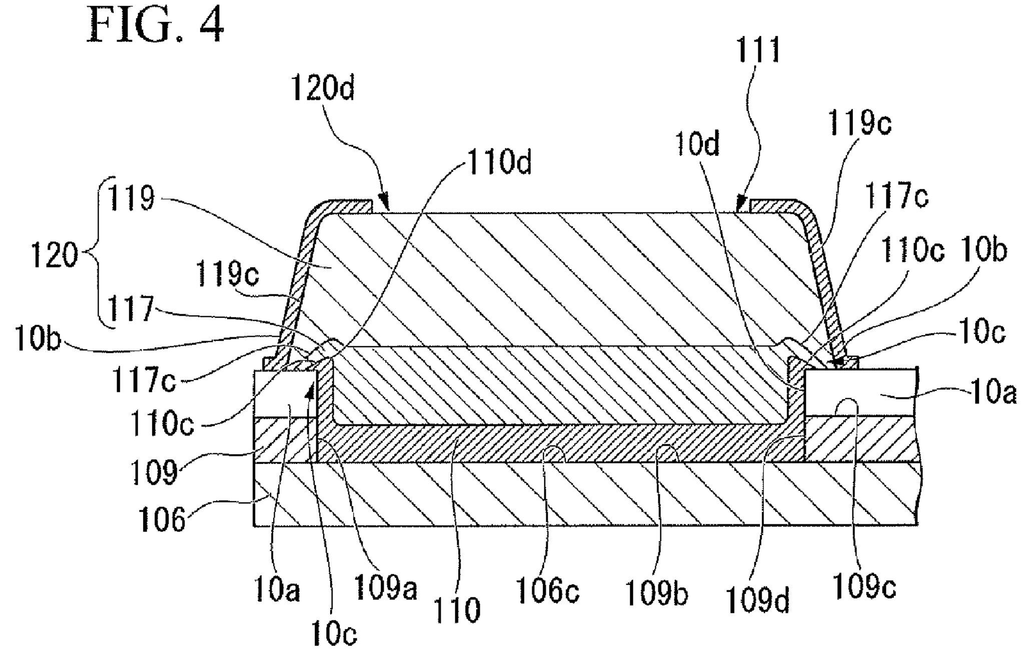
FIG. 4 is a schematic enlarged cross-sectional view of a p-type electrode constituting a semiconductor light-emitting device illustrated in FIG. 1.

FIG. 1 to FIG. 4 are views illustrating an example of a semiconductor light-emitting device of the present invention. FIG. 1 is a schematic cross-sectional view illustrating an example of a semiconductor light-emitting device. FIG. 2 is a schematic plan view of a semiconductor light-emitting device illustrated in FIG. 1. FIG. 3 is an enlarged schematic cross-sectional view of a laminated semiconductor layer constituting a semiconductor light-emitting device illustrated in FIG. 1. FIG. 4 is a schematic enlarged cross-sectional view of a p-type electrode constituting a semiconductor light-emitting device illustrated in FIG. 1.

As shown in FIG. 1, a semiconductor light-emitting device 1 of the present embodiment includes: a substrate 101; a laminated semiconductor layer 20 which is formed on the substrate 101; a p-type electrode 111 (a first electrode) formed on the upper surface 106*c* of the laminated semiconductor layer 20; and a n-type electrode 108 (a second electrode) formed on an exposed surface 104*c* that is formed by partially cutting the laminated semiconductor layer 20.

As shown in FIG. 1, the laminated semiconductor layer 20 is formed by laminating in order the n-type semiconductor layer 104, the light-emitting layer 105, and the p-type semiconductor layer 106 on the substrate 101. The semiconductor light-emitting device 1 of the present embodiment is configured to obtain light emitted from the light-emitting layer 105 by applying a voltage and flowing a current between the p-type electrode 111 and the n-type electrode 108. Also, the semiconductor light-emitting device 1 of the present embodiment is a face up mount type light-emitting device which is configured to extract the light from the side where the p-type electrode 111 is formed.

<Substrate>

The substrate 101 may be selected and used from various kinds of substrates, without being specially limited, if the substrate 101 is a substrate on which a group III nitride semiconductor crystal is epitaxially grown onto the surface. For example, a substrate may be used, which is made of sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, and the like. Also, particularly, it is preferable to use a sapphire substrate having a c-surface as its main surface among the above-described substrates.

Note that, among the above-described substrates, it is preferable to use an oxide substrate or a metal substrate, etc. which is chemically modified through contact with ammonia at high temperature because the buffer layer 102 can be formed without using ammonia.

<Laminated Semiconductor Layer>

The laminated semiconductor layer 20 of the semiconductor light-emitting device 1 according to the present embodiment is made of a group III nitride semiconductor, and as illustrated in FIG. 1, the buffer layer 102, the ground layer 103, the n-type semiconductor layer 104, the light-emitting layer 105, and the p-type semiconductor layer 106 are laminated on the substrate 101 in order. As illustrated in FIG. 3, each layer of the n-type semiconductor layer 104, the light-emitting layer 105, and the p-type semiconductor layer 106 may be formed as a plurality of semiconductor layers.

<Buffer Layer>

The buffer layer 102 functions to make it easy to form the C-axis oriented monocrystal layer on the (0001) C-surface of the substrate 101 by mitigating the difference in lattice constant between the substrate 101 and the ground layer 103. In the present invention, it is preferable to form a buffer layer 102, but such a buffer layer 102 may not be formed.

The thickness of the buffer layer 102, for example, may be within a range from 0.01 to 0.5 μm. If the thickness of the buffer layer 102 is less than 0.01 μm, an effect of mitigating a difference in lattice constant between the substrate 101 and the ground layer 103 may not be sufficiently obtained by the buffer layer 102. Also, if the thickness of the buffer layer 102 exceeds 0.5 μm, even if functioning as the buffer layer 102 is not changed, the time for the step of forming the buffer layer 102 is lengthened, thus deteriorating the productivity.

The buffer layer 102 is made of a group III nitride semiconductor and is preferably made of polycrystal $Al_xGa_{1-x}N$ ($0 \leq x \leq 1$) or monocrystal $Al_xGa_{1-x}N$ ($0 \leq x \leq 1$). The crystal of the group III nitride semiconductor that forms the buffer layer 102 may have a polycrystal structure or a monocrystal structure. Since the crystal of the group III nitride semiconductor controls the growth condition, it grows not only in an upward direction but also in an in-plane direction to form the monocrystal structure. Accordingly, by controlling the film-forming condition of the buffer layer 102, the buffer layer 102 is made of the crystal of the group III nitride semiconductor of the monocrystal structure. When the buffer layer 102 having the monocrystal structure as described above is formed on the substrate 101, the buffer function of the buffer layer 102 is effectively performed, and thus the group III nitride semiconductor formed thereon becomes a crystal layer having good orientation and crystallinity.

Also, the buffer layer 102 may have a crystal structure of a hexagonal crystal system that is made of a group III nitride semiconductor. Also, by controlling the film-forming condition, the crystal of the group III nitride semiconductor that forms the buffer layer 102 may become a column type crystal (polycrystal) comprised of a texture based on a hexagonal prism. Here, the column type crystal comprised of the texture means a crystal in which grain boundaries are formed between neighboring grains separated from each other and which is itself a column type that has a vertical profile.

Although the buffer layer 102 may be formed by a MOCVD method, it may also be formed by a sputtering method. In the case of forming the buffer layer 102 by a sputtering method, it is possible to suppress the temperature of the substrate 101 at low temperature during the formation of the buffer layer 102, and thus even in the case of using the substrate 101 made of a material having a property that is decomposed at high temperature, the respective layers can be preferably formed on the substrate 101 without damaging the substrate 101.

<Ground Layer>

When the monocrystal ground layer 103 is laminated on the buffer layer 102, the ground layer 103 can be laminated with much higher crystallinity. Although the ground layer 103 may be $Al_xGa_yIn_zN$ ($0 \leq x \leq 1$, $0 \leq y \leq 1$, $0 \leq z \leq 1$, $x+y+z=1$), the under-layer 103 having a good crystallinity can be preferably formed using $Al_xGa_{1-x}N$ ($0 \leq x < 1$).

The thickness of the under-layer 103 is preferably equal to or more than 0.1 μm, more preferably equal to or more than 0.5 μm, and most preferably equal to or more than 1 μm. By forming the under-layer with a thickness equal to or more than 1 μm, a layer of $Al_xGa_{1-x}N$ having a good crystallinity can be easily obtained.

However, in order to form the under-layer 103 with a good crystallinity, it is preferable that the under-layer 103 is not doped with impurities. However, in the case where the p-type or n-type conductivity is necessary, an acceptor impurity or a donor impurity may be added.

<N-Type Semiconductor Layer>

As illustrated in FIG. 3, it is preferable that the n-type semiconductor layer 104 is comprised of an n-contact layer **104*a* and an n-clad layer 104*b*. In this case, it is also possible that the n-contact layer 104*a* also serves as the n-clad layer 104*b***.

The n-contact layer **104*a* is a layer for installing an n-type electrode 108. It is preferable that the n-contact layer 104*a*** is made of an $Al_xGa_{1-x}N$ layer ($0 \leq x < 1$, preferably $0 \leq x \leq 0.5$, and more preferably $0 \leq x \leq 0.1$).

Also, it is preferable that the n-contact layer **104*a* is doped with an n-type impurity. If the n-type impurity is contained at density of $1 \times 10^{17}$ to $1 \times 10^{20}/cm^3$, and preferably at density of $1 \times 10^{18}$ to $1 \times 10^{19}/cm^3$, it is advantageous in maintaining a good ohmic contact with the n-type electrode 108**. The n-type impurity, although not specially limited, for example, may be Si, Ge, Sn, or the like, and preferably may be Si or Ge.

Preferably, the thickness of the n-contact layer **104*a* is within the range of 0.5 to 5 μm, and more preferably, within the range of 1 to 3 μm. If the thickness of the n-contact layer 104*a*** is in the above-described range, the crystallinity of the semiconductor can be maintained well.

The n-clad layer **104*b* is a layer that performs carrier injection and carrier confinement in the light-emitting layer 105. The n-clad layer 104*b* can be formed of AlGaN, GaN, GaInN, and the like. Also, the n-clad layer 104*b* may have a superlattice structure in which the above-described structures are heterojunctioned or laminated plural times. In the case of forming the n-clad layer 104*b* with GaInN, it is undoubtedly preferable to form the n-clad layer with a size that is larger than a band gap of GaInN of the light-emitting layer 105**.

The thickness of the n-clad layer **104*b*, although not specially limited, may be preferably within the range of 0.005 to 0.5 μm, and more preferably within the range of 0.005 to 0.1 μm. The n-type doping density of the n-clad layer 104*b*** is preferably $1 \times 10^{17}$ to $1 \times 10^{20}/cm^3$, and more preferably $1 \times 10^{18}$ to $1 \times 10^{19}/cm^3$. If the doping density is in this range, it is advantageous in maintaining a good crystallinity and in reducing the operation voltage of the device.

At this time, in the case where the n-clad layer **104*b* is a layer including the superlattice structure, it may include a structure in which an n-side first layer comprised of a group III nitride semiconductor having a thickness equal to or less than 100 Å and an n-side second layer comprised of a group III nitride semiconductor having a composition different from that of the n-side first layer and having a thickness equal to or less than 100 Å are laminated. Also, the n-clad layer 104*b* may include a structure in which the n-side first layer and the n-side second layer are alternately and repeatedly laminated. Also, preferably, any one of the n-side first layer and the n-side second layer has a construction that is in contact with an active layer (light-emitting layer 105**).

The n-side first layer or the n-side second layer may be a composition of an AlGaN system (which may be simply described as AlGaN) including Al, a GaInN system (which may be simply described as GaInN) including In, and GaN. Also, the n-side first layer or the n-side second layer may be a GaInN/GaN alternating structure, an AlGaN/GaN alternating structure, a GaInN/AlGaN alternating structure, a GaInN/GaInN alternating structure having different composition (herein, the term "different composition" indicates that the composition ratio of the respective elements is different, and the same may be said hereinafter), or an AlGaN/AlGaN alternating structure having different composition.

The superlattice layers of the n-side first layer and the n-side second layer are preferably equal to or less than 60 Å, more preferably equal to or less than 40 Å, and most preferably within the range of 10 Å to 40 Å, respectively. If the thickness of the n-side first layer and the n-side second layer that constitute the superlattice layer exceeds 100 Å, the crystal may be defective, and thus it is not preferable.

The n-side first layer and the n-side second layer may have a doped structure or a combination of doped/undoped structures. As doping impurities, known impurities in the related art may be applied to the above-described material composition without any limitation. For example, in the case of using the GaInN/GaN alternating structure or the GaInN/GaInN alternating structure having different composition as the n-clad layer 104*b*, Si is suitable as an impurity. Also, the n-side superlattice multi-layer as described above may be manufactured by properly turning on/off the doping even if the same composition represented by the GaInN, AlGaN, or GaN is used. The n-side first layer and the n-side second layer that constitute the superlattice layer may be manufactured by using a material with the same composition and properly turning on/off the doping.

<Light Emitting Layer>

The light-emitting layer 105 has a multiple quantum well structure as illustrated in FIG. 3. In the multiple quantum well structure of the light-emitting layer 105 illustrated in FIG. 3, the $Ga_{1-y}In_yN$ ($0 \le y < 0.4$) becomes the well layer 105*b*, and the $Al_zGa_{1-z}N$ ($0 \le z < 0.3$) having a band gap energy that is larger than that of the well layer 105*b* becomes a bather layer 105*a*. The impurities may or may not be doped into the well layer 105*b* and the barrier layer 105*a*. The well layer 105*b* may have a thickness enough to obtain the quantum effect, and for example, the thickness of the well layer 105*b* may be within the range of 1 to 10 nm, and preferably within the range of 2 to 6 nm, which is preferable in view of light emission. Herein, the light-emitting layer 105 may have a multiple quantum well structure or a single quantum well structure.

<P-Type Semiconductor Layer>

As illustrated in FIG. 3, the p-type semiconductor layer 106 is comprised of a p-clad layer 106*a* and a p-contact layer 106*b*. In this case, it is also possible that the p-contact layer 106*b* also serves as the p-clad layer 106*a*.

The p-clad layer 106*a* is a layer that performs carrier confinement and carrier injection in the light-emitting layer 105. The p-clad layer 106*a*, although not specially limited, may have a composition that becomes larger than the band gap energy of the light-emitting layer 105 and may confine the carrier of the light-emitting layer 105, and preferably, may be $Al_xGa_{1-x}N$ ($0 < x \le 0.4$). If the p-clad layer 106*a* is comprised of the AlGaN as described above, it is preferable in confining the carrier of the light-emitting layer 105.

The p-clad layer 106*a*, although not specially limited, may have a thickness preferably within the range of 1 to 400 nm, and more preferably within the range of 5 to 100 nm.

Also, the p-type doping density of the p-clad layer 106*a* is preferably within the range of $1\times10^{18}$ to $1\times10^{21}/cm^3$, and more preferably within the range of $1\times10^{19}$ to $1\times10^{20}/cm^3$. If the p-type doping density is in this range, a good p-type crystal is obtained without deteriorating the crystallinity.

Also, the p-clad layer 106*a* may be a layer having a superlattice structure. In the case of making the p-clad layer 106*b* as a layer including the superlattice structure, it may include a structure in which a p-side first layer comprised of a group III nitride semiconductor having a thickness equal to or less than 100 Å and a p-side second layer comprised of a group III nitride semiconductor having a composition different from that of the p-side first layer and having a thickness equal to or less than 100 Å are laminated. Also, it may include a structure in which the p-side first layer and the p-side second layer are alternately and repeatedly laminated.

The p-side first layer or the p-side second layer may be a different composition, and for example, may be any composition of AlGaN, GaInN, or GaN, or may be a GaInN/GaN alternating structure, an AlGaN/GaN alternating structure, or a GaInN/AlGaN alternating structure.

In the present invention, it is preferable that the p-side first layer or the p-side second layer is a AlGaN/AlGaN alternating structure or an AlGaN/GaN alternating structure.

The superlattice layers of the p-side first layer and the p-side second layer are preferably equal to or less than 60 Å, more preferably equal to or less than 40 Å, and most preferably within the range of 10 to 40 Å. If the thickness of the p-side first layer and the p-side second layer that constitute the superlattice layer exceeds 100 Å, the crystal may be greatly defective, and thus it is not preferable.

The p-side first layer and the p-side second layer may be a doped structure or a combination of doped/undoped structures. As doping impurities, known impurities in the related art may be applied to the above-described material composition without any limitation. For example, in the case of using the AlGaN/GaN alternating structure or the AlGaN/AlGaN alternating structure having different composition as the p-clad layer, Mg is suitable as an impurity. Also, the p-side first layer and the p-side second layer that constitute the superlattice layer may be manufactured by using a material with the same composition and properly turning on/off the doping.

The p-contact layer 106*b* is a layer for installing the p-type electrode 111 that is a positive electrode. It is preferable that the p-contact layer 106*b* is made of an $Al_xGa_{1-x}N$ layer ($0 \le x \le 0.4$). If the Al composition is in the above-described range, it is preferable in maintaining a good crystallinity and a good ohmic contact with the p-type electrode 111.

If the p-type contact layer 106*b* contains the p-type impurity (dopant) at density of $1\times10^{18}$ to $1\times10^{21}/cm^3$, and preferably at density of $5\times10^{19}$ to $5\times10^{20}/cm^3$, it is preferable in maintaining a good ohmic contact, preventing crack generation, and maintaining a good crystallinity. The p-type impurity, although not specially limited, for example, may be Mg or the like.

The thickness of the p-contact layer 106*b*, although not specifically limited, is preferably 0.01 to 0.5 μm, and more preferable 0.05 to 0.2 μm. If the thickness of the p-contact layer 106*b* is in this range, it is preferable in view of the light emission output.

<P-Type Electrode>

The p-type electrode 111, as illustrated in FIG. 4, includes a transparent electrode 109, a junction layer 110, and a bonding pad electrode 120.

As illustrated in FIG. 4, a hole portion 109*a*, through which the upper surface 106*c* of the laminated semiconductor layer 20 is exposed, is formed in a transparent electrode 109. Also, as illustrated in FIG. 1, in an area where the hole portion 109*a* is not formed on the upper surface 109*c* of the transparent electrode 109, a transparent protection film 10*a* is formed to cover the transparent electrode 109. In other words, an area where the hole portion 109*a* is formed is an opening 10*d* in which a portion of the transparent protection film 10*a* is open.

On the bottom surface 109*b* and the inner wall 109*d* of the hole portion 109*a* exposed from the opening 10*d*, the junction layer 110 is formed to cover the hole portion 109*a* and the opening 10*d*.

Also, in the semiconductor light-emitting device 1 of the present embodiment, the junction resistivity between the junction layer 110 and the laminated semiconductor layer 20 is higher than the junction resistivity between the junction layer 110 and the transparent electrode 109. Therefore, the junction layer 110 may ohmically contact the transparent electrode 109, and the junction layer 110 may not ohmically contact the upper surface 106*c* of the laminated semiconductor layer 20. In this case, in the semiconductor light-emitting device 1 of the present embodiment, the sufficient current is supplied to the light-emitting layer 105 that is positioned in the vicinity of the inner wall 109*d* of the hole portion 109*a* of the transparent electrode 109, and the strong light emission is obtained in the light-emitting layer 105 that is positioned in the vicinity of the inner wall 109*d* of the hole portion 109*a*. Also, the light emission distribution is formed in which the light emission from the light-emitting layer 105 radially diminishes from the inner wall 109*d* of the hole portion 109*a* toward the outside. Also, in the semiconductor light-emitting device 1 of the present embodiment, the amount of the current supplied to the light-emitting layer 105, which is positioned inside of the hole portion 109*a* of the transparent electrode 109 as planarly viewed, is small. Also, the light-emitting from the light-emitting layer 105, which is positioned inside of the hole portion 109*a* of the transparent electrode 109 as planarly viewed, may be small.

Also, on the junction layer 110, the bonding pad electrode 120 is formed to cover the junction layer 110. As illustrated in FIG. 4, an outer edge portion of the junction layer 110 and an outer edge portion of the bonding pad electrode 120 (a metal reflection layer 117 and a bonding layer 119) are arranged on the transparent protection film 10*a*. Also, the bonding pad electrode 120 is provided with an slope 119*c*, which is made gradually thinner toward the outside and is formed on an outer circumference portion 120*d* of the bonding pad electrode 120. In the semiconductor light-emitting device 1 of the present embodiment, as illustrated in FIG. 4, the outer edge portion of the bonding pad electrode 120 is covered by an edge portion protection film 10*b*.

[Transparent Electrode]

The transparent electrode 109, as illustrated in FIG. 1, is installed on the upper surface 106*c* of the p-type semiconductor layer 106, and as illustrated in FIG. 4, is provided with the hole portion 109*a* through which the upper surface 106 of the laminated semiconductor layer 20 is exposed. The planar shape of the hole portion 109*a* of the transparent electrode 109 may be an arbitrary shape such as circular shape or polygonal shape, and, although not specifically limited, is preferably a circular shape to make the bonding work easy as illustrated in FIG. 2.

Also, the transparent electrode 109, as illustrated in FIG. 2, as planarly viewed, is formed to cover the almost entire upper surface 106*c* of the p-type semiconductor layer 106. However, the transparent electrode 109 is not limited to such a shape, and may be formed in a lattice shape or in a tree shape at predetermined intervals.

Also, the hole portion 109*a* of the transparent electrode 109 may be formed anywhere on the upper surface 106*c* of the p-type semiconductor layer 106. For example, it may be formed on a position that is farthest from the n-type electrode 108, or may be formed in the center of the semiconductor light-emitting device 1. However, if the bonding pad electrode 120 is formed on a position that is too close to the n-type electrode 108, short circuiting may occur between the wires or balls when the wire is bonded to the bonding pad electrode 120 that is formed on the hole portion 109*a*, and thus it is not preferable.

It is preferable that the transparent electrode 109 have a small contact resistance with the p-type semiconductor layer 106. Also, it is preferable that the transparent electrode 109 have a superior light permeability in order to efficiently extract the light from the light-emitting layer 105 toward a side on which the p-type electrode 111 is formed. Also, in order to uniformly diffuse current over the whole surface of the p-type semiconductor layer 106, it is preferable that the transparent electrode 109 have a superior conductivity.

From the above-described contents, as the material of the transparent electrode 109, it is preferable to use a transparent conductive material selected from the group consisting of zinc sulfide, chromium sulfide, and a conductive oxide comprising any one kind selected from the group consisting of In, Zn, Al, Ga, Ti, Bi, Mg, W, Ce, Sn, and Ni.

Also, it is preferable that the conductive oxide be ITO (Indium Tin Oxide ($In_2O_3$—$SnO_2$)), IZO (Indium Zinc Oxide ($In_2O_3$—ZnO)), AZO (Aluminum Zinc Oxide (ZnO—$Al_2O_3$)), GZO (Gallium Zinc Oxide (ZnO—$Ga_2O_3$)), fluorine doped tin oxide, titanium oxide, or the like.

Also, it is preferable that the transparent electrode 109 have a crystallized structure from the viewpoint of the adhesion and transparency with the junction layer 110. In particular, it is preferable that the transparent electrode 109 include a transparent electrode (for example, ITO or IZO) including $In_2O_3$ crystal having a hexagonal crystal structure or a bixbyite structure.

In the case where the transparent electrode 109 is made of a crystallized IZO, it may be the IZO that includes an $In_2O_3$ crystal having a bixbyite crystal structure or the IZO that includes an $In_2O_3$ crystal having a hexagonal crystal structure. In particular, the IZO that includes the $In_2O_3$ crystal having the hexagonal crystal structure is preferable. The crystallized IZO film has good adhesion with the junction layer 110 and the p-type semiconductor layer 106 in comparison to the IZO film in an amorphous state, and thus it is very preferable.

Also, as the IZO film, it is preferable to use a composition that has the lowest resistivity. For example, the ZnO density inside the IZO is preferably within the range of 1 to 20% by mass, and more preferably within the range of 5 to 15% by mass. Particularly, it is preferable that the ZnO density be 10% by mass.

Also, the thickness of the IZO film is preferably within the range of 35 nm to 10000 nm (10 μm) in which low resistivity and high light permeability can be obtained. Further, from a view point of production cost, the thickness of the IZO film is preferably equal to or less than 1000 nm (1 μm).

[Junction Layer]

The junction layer 110 is laminated between the bonding pad electrode 120, and the laminated semiconductor layer 20 and the transparent electrode 109 in order to improve the junction strength of the bonding pad electrode 120 against the laminated semiconductor layer 20 and the transparent electrode 109.

As illustrated in FIG. 4, the junction layer 110 is formed to be installed inside the hole portion 109*a* of the transparent electrode 109 and the opening 10*d* of the transparent protection film 10*a*. In the present embodiment, the junction layer 110 is successively formed to cover the bottom surface 109*b* (the upper surface 106*c* of the laminated semiconductor layer 20) and the inner wall 109*d* of the hole portion 109*a*, and the end portion 10*c* of the transparent protection film 10*a*. Accordingly, it is possible to obtain the high junction strength between the junction layer 110, and the laminated semiconductor layer 20 and the transparent electrode 109.

Also, the thickness of the junction layer 110 is roughly uniform within the hole portion 109*a* and on the inner wall surface of the opening 10*d* of the transparent protection film 10*a*. Also, on the outside of the opening 10*d*, the junction layer 110 is gradually thinner toward the outside, and thus an slope 110*c* is formed on the outer circumference portion 110*d* of the junction layer 110.

Also, it is preferable that the junction layer 110 have transparency. In the case where the junction layer 110 has transparency, the light radiated from the light-emitting layer 105 onto the bonding pad electrode 120 can be transmitted through the junction layer 110 without loss. More specifically, in the case where the junction layer 110 has transparency, a portion of the light from the light-emitting layer 105 is transmitted through the transparent electrode 109 and the junction layer 110, and then is reflected by the bonding pad electrode 120 (in the present embodiment, the metal reflection layer 117) in the interface of the junction layer 110 and the bonding pad electrode 120. The light reflected by the bonding pad electrode 120 is introduced into the inside of the laminated semiconductor layer 20 again, repeats transmission and reflection, and then is extracted from a place except for the area where the bonding pad electrode 120 is formed to the outside of the semiconductor light-emitting device 1. Accordingly, in the case where the junction layer 110 has transparency, the light from the light-emitting layer 105 can be very efficiently extracted to the outside of the semiconductor light-emitting device 1.

The junction layer 110 is made of the material with the property in which the junction resistivity to the laminated semiconductor layer 20 is higher than the junction resistivity to the transparent electrode 109. Specifically, it is preferable that the junction layer 110 be made of at least one kind of element selected from the group consisting of Al, Ti, V, Cr, Mn, Co, Zn, Ge, Zr, Nb, Mo, Ru, Hf, Ta, W, Re, Rh, Ir, and Ni. For example, the transparent electrode 109 is formed of IZO, the upper surface 106*c* of the laminated semiconductor layer 20 is prepared using the p-type contact layer 106*b* made of p-GaN (Mg doping), and the junction layer 110 is formed of the above-described materials. Because of these configurations, the junction resistivity between the junction layer 110 and the laminated semiconductor layer 20 is higher than the junction resistivity between the junction layer 110 and the transparent electrode 109, and also, the bonding pad electrode 120 has the good transparency and junction strength against the laminated semiconductor layer 20 and the transparent electrode 109.

The junction layer 110 is made of preferably at least one kind of element selected from the group consisting of Cr, Ti, W, Mo, Zr, Hf, Co, Rh, Ir, and Ni, and more preferably at least one kind of element selected from the group consisting of Cr, Ti, W, Mo, Rh, Co, and Ni. In particular, by using a metal such as Cr, Ti, Mo, Ni, Co as the material of the junction layer 110, the junction strength of the bonding pad electrode 120 against the laminated semiconductor layer 20 and the transparent electrode 109 can be especially increased.

Also, in the case where, for example, the transparent electrode 109 is made of a metal oxide, such as IZO, ITO, and the bonding pad electrode 120 is made of Ag, Al, or the like, as materials of the junction layer 110, it is especially preferable to use Cr, from which a superior junction property is obtained, with respect to both the metal oxide and the Ag and Al.

Also, it is preferable that the junction layer 110 be a thin film of which the maximum thickness is equal to or more than 10 Å and equal to or less than 400 Å. By making the maximum thickness of the junction layer 110 in the above-described range, superior transparency is obtained and thus the light from the light-emitting layer 105 can be effectively transmitted without shielding. In this case, if the maximum thickness becomes less than 10 Å, the strength of the junction layer 110 is lowered, and thus the junction strength of the bonding pad electrode 120 against the laminated semiconductor layer 20 and the transparent electrode 109 is lowered to cause a non-preferable result.

[Bonding Pad Electrode]

The bonding pad electrode 120 is comprised of a laminated body in which the metal reflection layer 117 and the bonding layer 119 are laminated in order from the side of the transparent electrode 109. In this case, the bond pad electrode 120 may be a single-layer structure comprised of only the bonding layer 119, a single-layer structure comprised of only the metal reflection layer 117, or a three-layer structure that is obtained by inserting a barrier layer between the metal reflection electrode 117 and the bonding layer 119. In this case, metal elements, which form the junction layer 110, the metal reflection layer 117, the bonding layer 119, and the barrier layer, may include the same metal element or a combination of different metal elements.

In the present embodiment, although the reflection ratio of the bonding pad electrode 120 is greatly changed according to the constituent materials of the metal reflection layer 117, the reflection ratio is preferably equal to or more than 60%. Further, the reflection ratio of the bonding pad electrode 120 is more preferably equal to or more than 80%, and further more preferably equal to or more than 90%. The reflection ratio can be relatively easily measured by a spectrophotometer and so on. However, since the bonding pad electrode 120 itself has a small area, it is difficult to measure the reflection ratio. Accordingly, for example, a "dummy substrate" which is made of transparent glass and has a larger area may be put into a chamber for forming the bonding pad electrode, and the same bonding pad electrode may be formed on the dummy substrate while the bonding pad electrode is formed, so that the reflection ratio of the bonding pad electrode formed on the dummy substrate may be measured.

As for the area of the bonding pad electrode 120, it is preferable that the bonding pad electrode 120 have a larger area to facilitate the bonding work. However, when the area of the boding pad electrode 120 is large, the current amount supplied from the bonding pad electrode 120 is small in the light-emitting layer 105 that planarly overlaps the boding pad electrode 120, and the amount of the light emission from the light-emitting layer 105 is small. Therefore, when the area of the bonding pad electrode 120 is larger, there is a problem that the amount of the light emission from the light-emitting layer 105 is insufficient. Specifically, for example, if the area of the bonding pad electrode 120 exceeds a half of the area on the transparent electrode 109, the light emission amount of the light-emitting layer 105 that planarly overlaps the boding pad electrode 120 is small, and thus the output deteriorates remarkably. In contrast, if the area of the bonding pad electrode 120 is too small, it becomes difficult to perform the bonding work, and thus the yield of the product deteriorates. Accordingly, the area of the bonding pad electrode 120 is preferably somewhat larger than the diameter of a bonding ball, and specifically in a roughly circular shape of which the upper surface's diameter is about 100 μm and of which the diameter becomes larger toward the side of the transparent protection film 10*a*.

<Metal Reflection Layer>

The metal reflection layer 117 is formed to cover the junction layer 110. On the outer circumference portion of the metal reflection layer 117, an slope 117*c*, which is made gradually thinner toward the outside, is formed. Accordingly, the metal reflection layer 117 is formed to completely cover the forefront end portion of the transparent protection film 10*a* of the slope 110*c* of the junction layer 110, that is, a boundary portion of the junction layer 110 that makes a contour-line as seen planarly viewed. In other words, as planarly viewed, the metal reflection layer 117 is formed to cover the junction layer 110 and further to project up to the outside of the junction layer 110, and thus no portion of the junction layer 110 is exposed from the lower part of the metal reflection layer 117.

The metal reflection layer 117 illustrated in FIG. 1 is made of preferably a metal having a high reflection ratio, and more preferably a platinum group metal, such as Ru, Rh, Pd, Os, Ir, Pt, Al, Ag, Ti, or an alloy including at least one kind of these metals. By forming the metal reflection layer 117 with one of the above-described materials, the light from light-emitting layer 105 can be effectively reflected. Among them, Al, Ag, Pt, or an alloy including at least one kind of these metals is superior on the point that it is easy to obtain and easy to handle. Also, Rh, Pd, Ir, Pt, or an alloy including at least one kind of these metals is appropriately used as the metal reflection layer 117 in view of its light reflection.

Also, it is preferable that the metal reflection layer 117 have a maximum thickness that is larger than the maximum thickness of the junction layer 110. By making the maximum thickness of the metal reflection layer 117 larger than the maximum thickness of the junction layer 110, the junction layer 110 is covered by the metal reflection layer 117 more reliably and completely.

Also, the maximum thickness of the metal reflection layer 117 is preferably 20 to 3000 nm. If the metal reflection layer 117 is thinner than this thickness range, a sufficient reflection effect may not be obtained. If the metal reflection layer 117 is thicker than the thickness range, any special advantage is not obtained, but only the processing time is lengthened with the waste of materials. The thickness of the metal reflection layer 117 is more preferably 50 to 1000 nm, and most preferably 100 to 500 nm.

<Bonding Layer>

The bonding layer 119 is formed to cover the metal reflection layer 117. Also, on the outer circumference portion of the bonding layer 119 (the outer circumference portion 120*d* of the bonding pad electrode 120), an slope 119*c*, which is made gradually thinner toward the outside, is formed. Accordingly, the bonding layer 119 is formed to completely cover the forefront end portion of the transparent protection film 10*a* of the slope 117*c* of the metal reflection layer 117, that is, a boundary portion of the metal reflection layer 117 that makes a contour-line as seen from a plane. That is, as seen from a plane, the bonding layer 119 is formed to cover the metal reflection layer 117 and further to project up to the outside of the metal projection layer 117, and thus no portion of the metal reflection layer 117 is exposed from the lower part of the bonding layer 119.

It is preferable that the bonding layer 119 as illustrated in FIG. 1 be made of Au, Al, or an alloy including at least one kind of these metals. Au and Al are metals having good adhesion with gold balls, which are often used as bonding balls, and by using Au, Al, or an alloy including at least one kind of these metals as the bonding layer 119, the bonding layer 119 has superior adhesion with the bonding wires. Among them, Au is particularly preferable.

Also, it is preferable that the bonding layer 119 be formed so that the maximum thickness of the bonding layer 119 is larger than that of the junction layer 110 and the metal reflection layer 117. By making the maximum thickness of the bonding layer 119 larger than that of the junction layer 110 and the metal reflection layer 117, the metal reflection layer 117 is covered by the bonding layer 119 more certainly and completely.

Also, the maximum thickness of the bonding layer 119 is preferably equal to or more than 50 nm and equal to or less than 2000 nm, and more preferably equal to or more than 100 nm and equal to or less than 1500 nm. If the maximum thickness of the bonding layer 119 is too thin, the adhesion with the bonding balls becomes insufficient, while if the maximum thickness of the bonding layer 119 is too thick, any special advantage is not obtained, but only the cost is increased.

<Barrier Layer>

The barrier layer is arranged between the metal reflection layer 117 and the bonding layer 119, and reinforces the strength of the entire bonding pad electrode 120. The barrier layer is made of a relatively strong metal material or is sufficiently thick. As a material of the barrier layer, Ti, Cr, Al, or the like, may be used, but it is preferable to use Ti having superior strength. Also, the maximum thickness of the barrier layer is preferably 20 to 3000 nm. If the barrier layer is too thin, a sufficient strength reinforcement effect is not obtained, while if the barrier layer is too thick, no special advantage is obtained, but only the cost is increased. The thickness of the barrier layer is more preferably 50 to 1000 nm, and most preferable 100 to 500 nm.

In this case, if the metal reflection layer 117 is mechanically strong, it is not surely necessary to form the barrier layer. For example, in the case where the metal reflection layer 117 is made of Al or Pt, the barrier layer is not surely necessary.

[Transparent Protection Film]

The transparent protection film 10*a* is to protect the transparent electrode 109 and the junction layer 110. The transparent protection film 10*a*, as illustrated in FIG. 1 and FIG. 2, is formed to cover an area where the hole portion 109*a* is not formed on the upper surface 109*c* of the transparent electrode 109, and an area where the hole portion 109*a* is formed becomes the opening 10*d*. In the present embodiment, as illustrated in FIG. 4, the junction layer 110 is formed to be in contact with the inner wall surface of the opening 10*d*, and an outer edge portion of the junction layer 110 is arranged to be in contact with the transparent protection film 10*a*. By the transparent protection film 10*a*, the portion that is in contact with the transparent protection film 10*a* of the junction layer 110 is prevented from being in contact with air or moisture.

Also, in the present embodiment, as illustrated in FIG. 4, outer edge portions of the metal reflection layer 117 and the boding layer 119 which constitute the bonding pad electrode 120 are arranged to be in contact with the transparent protection film 10*a*, and the entire outer surface of the junction layer 110 that is not in contact with the laminated semiconductor layer 20 and the transparent electrode 109 is surrounded by the transparent protection film 10*a* and the bonding pad electrode 120, so that the junction layer 110 is effectively prevented from being in contact with air or moisture.

The transparent protection film 10*a* is formed of preferably a material which is transparent and has superior adhesion with the respective layers of the transparent electrode 109, the junction layer 110, and the boding pad electrode 120, and more particularly $SiO_2$.

The thickness of the transparent protection film 10*a* is preferably 20 to 500 nm, and more preferably 50 to 300 nm. If the thickness of the transparent protection film 10*a* is less than this thickness range, a sufficient effect of protecting the transparent electrode 109 and the junction layer 110 may not be obtained. Also, if the thickness of the transparent protective film 10*a* exceeds the thickness range, transparency deteriorates, and a trouble may occur in extracting the light. Also, if the thickness of the transparent protective film 10*a* exceeds the thickness range, the depth that is obtained by adding the depth of the opening 10_d_ and the depth of the hole portion 109_a_ is increased, and this may cause a trouble in adhesion between the junction layer 110, and the hole portion 109_a_ and the inner wall surface of the opening 10_d_.

[Edge Portion Protection Film]

The edge portion protection film 10_b_ prevents the junction layer 110 from being in contact with air or moisture and prevents the bonding pad electrode 120 from peeling off from the semiconductor light-emitting device 1 to improve the junction strength of the bonding pad electrode 120. The edge portion protection film 10_b_, as illustrated in FIG. 2 and FIG. 4, is roughly in the form of a donut that exposes the center portion of the bonding pad electrode 120 as planarly viewed. Also, the edge portion protection film 10_b_, as illustrated in FIG. 1 and FIG. 2, is arranged over a juncture portion of the outer edge portion (contour-line) of the bonding pad electrode 120 and the transparent protective film 10_a_, and covers the outer edge portion of the bonding pad electrode 120 as planarly viewed. Accordingly, in the present embodiment, as illustrated in FIG. 4, the outer edge portion of the bonding pad electrode 120 is inserted between the transparent protective film 10_a_ and the edge portion protection film 10_b_.

As the area of the edge portion protection film 10_b_ becomes wider around the boundary portion of the bonding pad electrode 120 and the transparent protective film 10_a_, the effect obtained by installing the edge portion protection film 10_b_ becomes greater. However, if the area of the edge portion protection film 10_b_ is widened, the area of the bonding pad electrode 120 that is exposed from the edge portion protection film 10_b_ becomes smaller, and this may cause trouble in workability of the bonding work. Also, the edge portion protection film 10_b_ may deteriorate transparency of the area where the bonding pad electrode 120 is not formed to cause trouble in extracting the light. Accordingly, it is preferable that the edge portion protection film 10_b_ completely cover the boundary portions of the bonding pad electrode 120 and the transparent protective film 10_a_, and completely exposes the top head portion of the bonding pad electrode 120. Specifically, it is preferable that the edge portion protection film 10_b_ have a width of 5 to 10 μm around the boundary portion of the bonding pad electrode 120 and the edge portion protection film 10_b_.

The edge portion protection film 10_b_ is transparent, and is formed of preferably a material having superior adhesion between the transparent protective film 10_a_ and the bonding pad electrode 120, and more preferably the same material as the transparent protective film 10_a_. Specifically, the transparent protective film 10_a_ and the edge portion protection film 10_b_ may be formed of $SiO_2$. In the case where the edge portion protection film 10_b_ and the transparent protective film 10_a_ are formed of the same material, the adhesion between the edge portion protection film 10_b_ and the transparent protective film 10_a_ becomes remarkably good, and thus the effect obtained by installing the edge portion protection film 10_b_ can be much more improved.

<N-Type Electrode>

As illustrated in FIG. 1, the n-type electrode 108 is formed on the exposed surface 104_c_ of the n-type semiconductor layer 104. The exposed surface 104_c_ of the n-type semiconductor layer 104 is exposed by partially cutting and removing the light-emitting layer 105 and the p-type semiconductor layer 106 by a means such as etching.

As illustrated in FIG. 2, as planarly viewed, the n-type electrode 108 is in a circular shape. However, the shape of the n-type electrode 108 is not limited thereto, and may be an arbitrary shape such as a multi-angle shape. Also, the n-type electrode 108 also serves as a bonding pad, and thus is configured to connect a bonding wire. In this case, as the n-type electrode 108, various kinds of known compositions or structures may be installed by a common means well known in the technical field.

(Method of Manufacturing Semiconductor Light-Emitting Device)

Next, a method of manufacturing a semiconductor light-emitting device of the present invention will be described. The method of manufacturing a semiconductor light-emitting device of the present embodiment is the method of manufacturing the semiconductor light-emitting device 1 as illustrated in FIG. 1.

In order to manufacture a semiconductor light-emitting device 1 as illustrated in FIG. 1, a laminated semiconductor layer 20 is first formed on a substrate 101. By forming a laminated semiconductor layer 20 using the MOCVD method, a good crystallinity can be obtained. However, by optimizing the conditions in the formation of a laminated semiconductor layer 20 using the sputtering method, the crystallinity, which is more superior to that obtained in the MOCVD method, can be obtained.

<Formation of Laminated Semiconductor Layer>

For the formation of the laminated semiconductor 20 in the present embodiment, a substrate 101 such as a sapphire substrate or the like is firstly prepared, and a preprocessing of the substrate 101 is performed. The preprocessing of the substrate 101 may be performed by a method or the like that puts the substrate 101 in a chamber of a sputter device and performs sputtering before the formation of a buffer layer 102. Specifically, in the chamber, a preprocessing for cleaning an upper surface of the substrate 101 through exposure of the substrate 101 in Ar or $N_2$ plasma may be performed. By applying plasma of Ar gas or $N_2$ gas on the substrate 101, an organic material or oxide attached to the upper surface of the substrate 101 can be removed.

Next, on the upper surface of the substrate 101, a buffer layer 102 is laminated by a sputtering method. In the case of forming the buffer layer 102 having a monocrystal structure by a sputtering method, it is preferable that the ratio of nitrogen raw material flow rate to the inert gas flow rate in the chamber be 50% to 100%, and preferably 75%.

Also, in the case of forming the buffer layer 102 having a column type crystal (polycrystal) by the sputtering method, it is preferable that the ratio of nitrogen raw material flow rate to the inert gas flow rate in the chamber be 1% to 50%, and preferably 25%. In this case, the buffer layer 102 may also be formed by a MOCVD method in addition to the above-described sputtering method.

After the buffer layer 102 is formed, a monocrystal ground layer 103 is formed on the upper surface of the substrate 101 on which the buffer layer 102 is formed. It is preferable that the ground layer 103 be formed using the sputtering method. In the case of using the sputtering method, it is possible to use the device with a simple construction in comparison to the MOCVD method or MBE method. In the case of forming the ground layer 103 by the sputtering method, it is preferable to form the ground layer using a film-forming method by a reactive sputtering method that circulates a group V raw material such as nitrogen or the like in a reactor.

After the ground layer 103 is formed, the n-type semiconductor layer 104 is formed by laminating an n-contact layer 104_a_ and an n-clad layer 104_b_. The n-contact layer 104_a_ and the n-clad layer 104_b_ may be formed by a sputtering method or by a MOCVD method.

Next, the light-emitting layer 105 is formed. The light-emitting layer 105 can be formed by using any one of the sputtering method and the MOCVD method, and it is particularly preferable to use the MOCVD method. Specifically, the lamination of a barrier layer 105*a* and a well layer 105*b* is alternately repeated, and the barrier layer 105*a* is arranged in order on the side of the n-type semiconductor layer 104 and on the side of the p-type semiconductor layer 106.

Also, the p-type semiconductor layer 106 may be formed by any one of the sputtering method and the MOCVD method, and the p-type semiconductor layer 106 may be formed by sequentially laminating the p-clad layer 106*a* and the p-contact layer 106*b*.

[Formation of Electrode]

Through the above-described step, the laminated semiconductor layer 20 is formed, and then an n-type electrode 108 and a p-type electrode 111 are formed.

<N-Type Electrode Formation Step>

First, by performing a patterning using a known photolithography method, a portion of the n-contact layer 104*a* is exposed by etching a portion of the laminated semiconductor layer 20 in a predetermined area. Next, using a sputtering method or the like, the n-type electrode 108 is formed on the exposed surface 104*c* of the n-contact layer 104*a*.

<P-Type Electrode Formation Step>

Next, with reference to FIG. 5A to FIG. 5E, a step of manufacturing a p-type electrode 111 will be described. FIG. 5A to FIG. 5E is a view illustrating a step of manufacturing a p-type electrode, and an enlarged cross-sectional view illustrating only a portion of an area on which the p-type electrode 111 is manufactured.

Figure 5A:
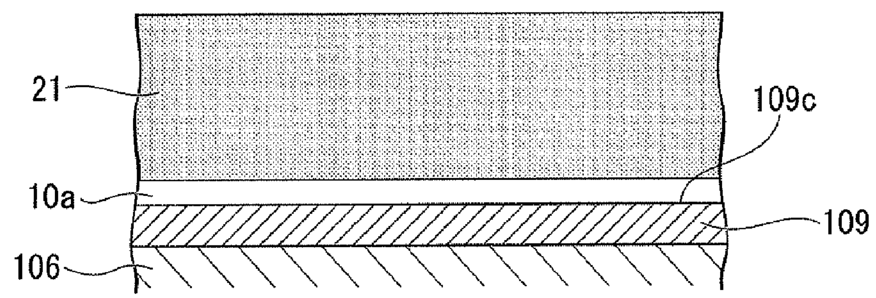
FIG. 5A is a view illustrating an example of a step of manufacturing a p-type electrode, and an enlarged cross-sectional view illustrating only a portion of an area in which a p-type electrode is manufactured.

As illustrated in FIG. 5A, in order to manufacture the p-type electrode 111 of the present embodiment, a transparent electrode 109 is first formed on the p-type semiconductor layer 106 of the laminated semiconductor layer 20. The transparent electrode 109 is formed in a manner that a mask that covers an area except for an area where the transparent electrode 109 is formed, such as the exposed surface 104*c* of the n-contact layer 104*a* on which the n-type electrode 108 is formed, the transparent electrode 109 is formed on the p-type semiconductor layer 106 using a known method such as a sputtering method, and then the mask is removed. In this case, the transparent electrode 109 may be formed after the n-type electrode 108 is formed, or may be formed before the etching of the laminated semiconductor layer 20 for forming the n-type electrode 108.

Next, as illustrated in FIG. 5A, a transparent protective film 10*a* is formed on the upper surface 109*c* of the transparent electrode 109, a resist 21 is coated on the transparent protective film 10*a*, and then a drying process is performed.

Figure 5B:
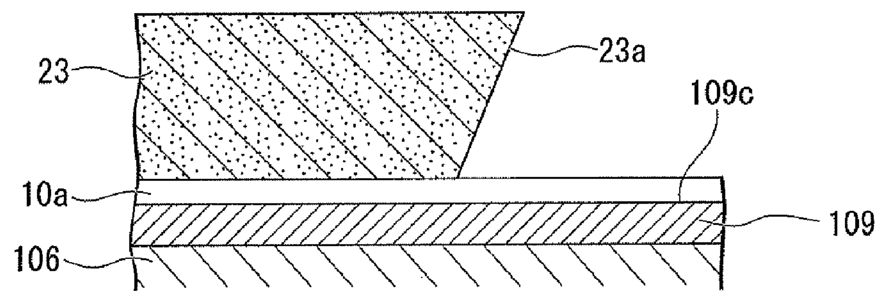
FIG. 5B is a view illustrating an example of a step of manufacturing a p-type electrode, and an enlarged cross-sectional view illustrating only a portion of an area in which a p-type electrode is manufactured.

Next, by removing the resist 21 on a portion that corresponds to the portion on which the bonding pad electrode 120 is formed, a reverse-tapered mask 23 illustrated in FIG. 5B, which has an opening 23*a* that is in the form of an inner wall of which the cross-sectional area is gradually widened toward the bottom surface, is formed on the upper surface 109*c* of the transparent electrode 109 on which the transparent protective film 10*a* is formed. The method of forming the reverse-tapered mask 23 may be a method using the n-type photoresist or a method using an image reversion type photoresist. In the present embodiment, with reference to FIG. 6A to FIG. 6D, a method of forming a mask as illustrated in FIG. 5B using the image reversion type photoresist will be described. FIG. 6A to FIG. 6D is a view illustrating a step of manufacturing a mask illustrated in FIG. 5B, and enlarged cross-sectional views illustrating only an area in which one p-type electrode 111 is formed.

In the present embodiment, as a resist 21, insoluble resist that is an image reversion type photoresist is used. As the image reversion type photoresist, for example, AZ5200NJ (product name: product of AZ Electronic Materials) may be used.

Figure 6A:
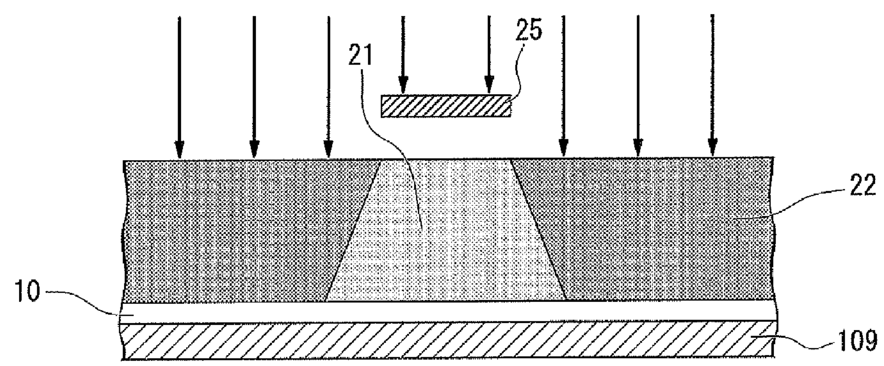
FIG. 6A is a view illustrating a step of manufacturing a mask illustrated in FIG. 5B, and an enlarged cross-sectional view illustrating only a portion of an area in which a p-type electrode is manufactured.

Next, as illustrated in FIG. 6A, a mask 25 is arranged to cover a predetermined position on the upper side of the resist 21, and as indicated by an arrow in FIG. 6A, light of a predetermined intensity and wavelength is radiated from the side of the mask 25 to the side of the resist 21. Accordingly, an optical reaction of the resist 21 on a portion, to which the light is radiated, occurs to form a soluble portion 22. Since this optical reaction progresses in accordance with the intensity of light, the light reaction progresses fast on the light irradiation surface side, and the light reaction progresses slowly on the side of the transparent electrode 109. Due to this, the soluble portion 22, as seen from the cross-section, as illustrated in FIG. 6A, is formed to be in a reverse-tapered shape (reversely inclined shape), in which the side surface of the portion is inwardly receded toward the lower side of the portion. Also, the resist 21 of the portion covered by the mask 25 remains as the insoluble resist (insoluble portion) 21, and as seen from the cross-section, is formed to be in a tapered shape (inclined shape), in which the side surface is inwardly receded toward the upper side thereof.

Figure 6B:
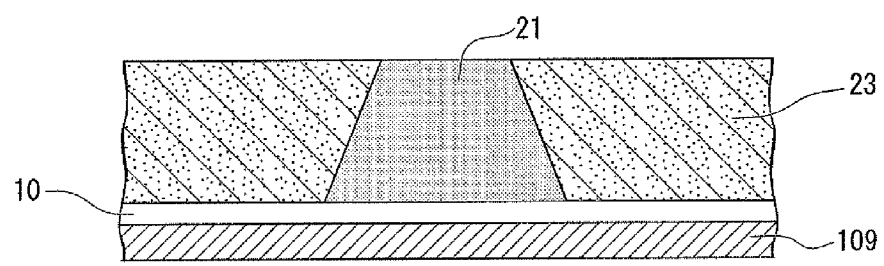
FIG. 6B is a view illustrating a step of manufacturing a mask illustrated in FIG. 5B, and an enlarged cross-sectional view illustrating only a portion of an area in which a p-type electrode is manufactured.

Next, using a heating device such as a hot plate or an oven, the substrate is heated, and as illustrated in FIG. 6B, the soluble portion 22 is made to thermally react to form the hardened portion (mask) 23 comprised of crosslinked polymer.

Figure 6C:
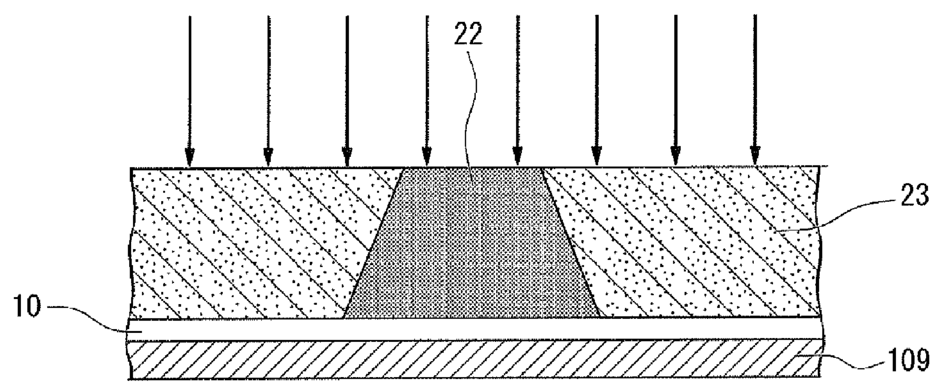
FIG. 6C is a view illustrating a step of manufacturing a mask illustrated in FIG. 5B, and an enlarged cross-sectional view illustrating only a portion of an area in which a p-type electrode is manufactured.

Thereafter, as illustrated in FIG. 6C, the light with the predetermined intensity and wavelength is radiated onto the insoluble resist 21 and the surface side of the hardened portion (mask) 23 comprised of the crosslinked polymer, without using a mask, and an optical reaction of the insoluble resist 21 as described above using FIG. 6A, which has not been transformed into the soluble resist 22, occurs to form the soluble portion 22.

Figure 6D:
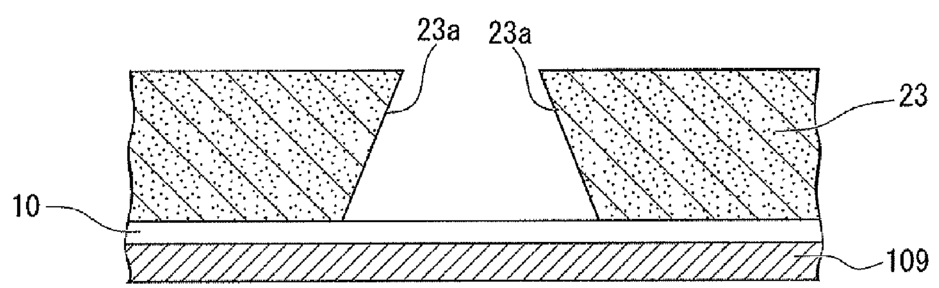
FIG. 6D is a view illustrating a step of manufacturing a mask illustrated in FIG. 5B, and an enlarged cross-sectional view illustrating only a portion of an area in which a p-type electrode is manufactured.

Lastly, by dissolving and removing the soluble portion 22 as illustrated in FIG. 6C using a predetermined developing solution, as illustrated in FIG. 6D, the mask 23 comprised of crosslinked polymer, in a reverse-tapered shape (reversely inclined shape), having an opening 23*a*, in which the side surface is inwardly receded toward the lower side of the portion, is obtained.

Figure 5C:
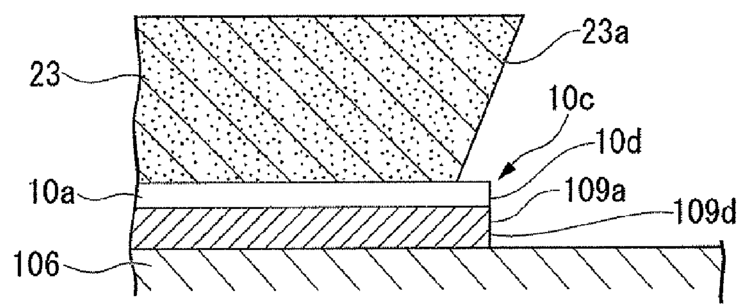
FIG. 5C is a view illustrating an example of a step of manufacturing a p-type electrode, and an enlarged cross-sectional view illustrating only a portion of an area in which a p-type electrode is manufactured.

Then, by removing the transparent protective film 10*a* that is exposed from the opening 23*a* of the mask 23 as illustrated in FIG. 5B using RIE (Reactive Ion Etching) in a direction vertical to the upper surface 109*c* of the transparent electrode 109, as illustrated in FIG. 5C, an opening 10*d* is formed, through which the upper surface 109*c* of the transparent electrode 109 is exposed for the opening 10*d*. Since the RIE (Reactive Ion Etching) is an etching method which has high directivity and low curvature, as seen from the etching direction (upper side in FIG. 5A to FIG. 5E), the transparent protective film 10*a* that becomes a shadow of the mask 23 is hardly etched and removed, and as illustrated in FIG. 5C, the end portion 10*c* of the transparent protective film 10*a* remains.

Thereafter, as illustrated in FIG. 5C, by etching the transparent electrode 109 that is exposed from the opening 10*d* of the transparent protection film 10*a*, the hole portion 109*a* is formed in the transparent electrode 109. By forming the hole portion 109*a*, the inner wall 109*d* of the hole portion 109*a* that is exposed from the transparent electrode 109 has superior adhesion with the junction layer 110 in comparison to the upper surface 109*c* of the transparent electrode 109.

Here, for example, in the case where the transparent electrode 109 that is etched is an IZO film in an amorphous state, the hole portion 109*a* of a specified shape can be formed due to the superior etching property. The IZO film in an amorphous state can be easily etched with good accuracy using a known etchant (ITO-07N etchant (product of Kanto Chemical Co., Ltd.)). Also, the etching of the IZO film in an amorphous state may be performed using a dry etching device. In this case, $Cl_2$, $SiCl_4$, $BCl_3$, and the like, may be used as an etching gas.

Also, it is preferable that the IZO film in an amorphous state be an IZO film including $In_2O_3$ crystal of a hexagonal crystal structure or an IZO film including $In_2O_3$ crystal of a bixbyite structure by performing heat-treatment. By shifting the film in an amorphous state into a structure that includes the crystal by the heat-treatment or the like, the transparent electrode 109 having good transparency and adhesion with the junction layer 110 rather than the amorphous IZO film can be made. However, since it is difficult to perform the etching of the IZO film including $In_2O_3$ crystal of a hexagonal crystal structure, it is preferable to perform the heat-treatment after the above-described etching process.

In the case of crystallizing the IZO film in an amorphous state, if the film-forming condition, heat-treatment condition, or the like, is different, the crystal structure in the IZO layer becomes different. The heat-treatment for crystallizing the IZO film is performed preferably in the atmosphere that does not include $O_2$. The atmosphere that does not include $O_2$ may be an inert gas atmosphere such as $N_2$ atmosphere, a mixed gas atmosphere including an inert gas such as $N_2$ and $H_2$, or the like, and preferably an $N_2$ atmosphere or a mixed gas atmosphere including $N_2$ and $H_2$. In this case, if the heat-treatment of the IZO film is performed in an $N_2$ atmosphere or a mixed gas atmosphere including $N_2$ and $H_2$, for example, it is possible to crystallize the IZO film on a film that includes $In_2O_3$ crystal of a hexagonal crystal structure and to effectively reduce sheet resistance of the IZO film.

Also, the heat-treatment temperature for crystallizing the IZO film is preferably 500° C. to 1000° C. In the case of performing the heat-treatment at a temperature less than 500° C., the IZO film may not be sufficiently crystallized, and thus the light permeability of the IZO film may not be sufficiently high. In the case of performing the heat-treatment at a temperature exceeding 1000° C., the IZO film may be crystallized, but the light permeability of the IZO film may not be sufficiently high. Also, In the case of performing the heat-treatment at a temperature exceeding 1000° C., the semiconductor layer located below the IZO film may deteriorate.

Figure 5D:
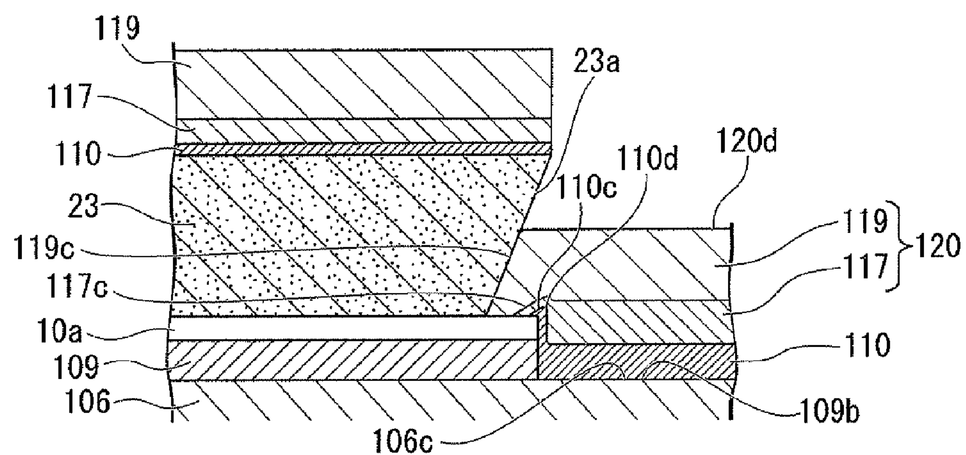
FIG. 5D is a view illustrating an example of a step of manufacturing a p-type electrode, and an enlarged cross-sectional view illustrating only a portion of an area in which a p-type electrode is manufactured.

Next, as illustrated in FIG. 5D, by the sputtering method, the junction layer 110 is formed to cover the bottom surface 109*b* and the inner wall 109*d* of the hole portion 109*a*. In this case, by using the sputtering method that controls the sputter conditions, the junction layer 110 can be formed with high coverage. Accordingly, the junction layer 110 is formed to cover the entire bottom surface 109*b* and the entire inner wall 109*d* of the hole portion 109*a*, the entire surface on the inner wall surface of the opening 10*d* of the transparent protective film 10*a*, and a portion of the end portion 10*c* of the transparent protective film 10*a*, and on the outer circumference portion 110*d* of the junction layer 110, an slope 110*c*, which is made gradually thinner toward the outside, is formed.

In this case, before the junction layer 110 is formed, it is may preferably perform preprocessing for cleaning the bottom surface 109*b* (the upper surface 106*c* of the laminated semiconductor layer 20) and the inner wall 109*d* of the hole portion 109*a* on which the junction layer 110 is formed. Here, the cleaning method may be a dry process that exposes the transparent electrode to plasma or the like and a wet process that makes the transparent electrode in contact with a chemical solution, and from the viewpoint of convenience in the process, the dry process is preferable.

Next, by the sputtering method, the metal reflection layer 117 is formed. In this case, in the same manner as the case of forming the junction layer 110, the sputtering method that controls the sputter conditions is used, and thus the coverage of the metal reflection layer 117 can be heightened. The metal reflection layer 117 is formed, which covers the junction layer 110 and has a slope 117*c*, which is formed on the outer circumference portion of the metal reflection layer 117 and is made gradually thinner toward the outside.

Next, by the sputtering method, the bonding layer 119 is formed. In this case, by using the sputtering method that controls the sputter conditions, the bonding layer 119 can be formed with high coverage. The bonding layer 119 (bonding pad electrode 120) is formed, of which the outer circumference portion is shaped along the inner wall shape of the opening 23*a* of the mask 23, and which covers the metal reflection layer 117 and has an slope 119*c*, which is formed on the outer circumference portion 120*d* of the bonding layer 119 and is made gradually thinner toward the outside.

Figure 5E:
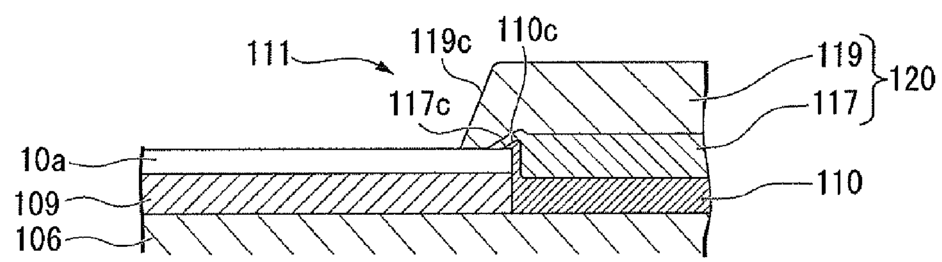
FIG. 5E is a view illustrating an example of a step of manufacturing a p-type electrode, and an enlarged cross-sectional view illustrating only a portion of an area in which a p-type electrode is manufactured.

Thereafter, by soaking in a resist peel-off solution, the mask 23 comprised of crosslinked polymer is peeled off. Accordingly, as illustrated in FIG. 5E, the bonding pad electrode 120 comprised of the metal reflection layer 117 and the bonding layer 119 is formed.

In the present embodiment, since the mask 23 including the opening 23*a* having the inner wall shape, of which the cross-sectional area is gradually widened toward a bottom surface, is formed, and the junction layer 110, the metal reflection layer 117, and the bonding layer 119 are formed by the sputtering method having high coverage, layers having different inclination angles are formed according to the thickness of the respective layers including the junction layer 110, the metal reflection layer 117, and the bonding layer 119 in an area that becomes a shadow of the mask 23 as seen from the sputter direction. Accordingly, on the outer circumference portions of the junction layer 110, the metal reflection layer 117, and the bonding layer 119, slopes 110*c*, 117*c*, and 119*c*, which are made gradually thinner toward the outer circumference, are formed.

Next, using a known method, the edge portion protection film 10*b*, which is roughly in the form of a donut that exposes the center portion of the bonding pad electrode 120 as planarly viewed, and covers the outer edge portion of the bonding pad electrode 120 over a juncture portion of the outer edge portion (contour-line) of the bonding pad electrode 120 and the transparent protective film 10*a*, is formed.

In the present embodiment, on the outer circumference portion 120*d* of the bonding pad electrode 120, an slope 119*c*, which is made gradually thinner toward the outside, is formed, and the edge portion protection film 10*b* is easily formed on the slope 119*c* of the bonding pad electrode 120 with a uniform thickness. By this, a portion, in which the edge portion protection film 10*b* is not formed on the portion that is a juncture portion of the outer edge portion (contour-line) of the bonding pad electrode 120 and the transparent protective film 10*a*, is prevented from occurring, and thus the edge portion protection film 10*b* can be easily and closely formed over the portion that is a juncture portion of the outer edge portion (contour-line) of the bonding pad electrode 120 and the transparent protective film 10*a* with a uniform thickness.

Accordingly, the semiconductor light-emitting devices 1 having a p-type electrode 111 as illustrated in FIG. 1 to FIG. 3 are formed.

In the semiconductor light-emitting device 1 of the present embodiment, the p-type electrode 111 includes the transparent electrode 109 containing the hole portion 109*a* through which the upper surface 106*c* of the laminated semiconductor layer 20 is exposed; the junction layer 110 formed on the bottom surface 109*b* and the inner wall 109*d* of the hole portion 109*a*; and the bonding pad electrode 120 formed to cover the junction layer 110. Also, the junction resistivity between the junction layer 110 and the laminated semiconductor layer 20 is higher than the junction resistivity between the junction layer 110 and the transparent electrode 109. Therefore, the current from the boding pad electrode 120 is mainly diffused in the in-plane direction of the transparent 109 from the inner wall 109*d* of the hole portion 109*a* of the transparent electrode 109 through the junction layer 110, and is supplied on the upper surface of the laminated semiconductor layer 20. The amount of the current supplied through the transparent electrode 109 among the current supplied to the laminated semiconductor 20 is larger than the amount of the current directly supplied from the junction layer 110 that contacts the laminated semiconductor layer 20.

Accordingly, in the semiconductor light-emitting device 1 of the present embodiment, the amount of the current supplied to the light-emitting layer 105, which is positioned inside of the hole portion 109*a* of the transparent electrode 109 as planarly viewed, is small. Also, the light-emitting from the light-emitting layer 105, which is positioned inside of the hole portion 109*a* of the transparent electrode 109 as planarly viewed, is small. Consequently, even though the bonding pad electrode 120, which cover the junction layer 110 formed on the bottom surface 109*b* and the inner wall 109*d* of the hole portion 109*a* of the transparent electrode 109, does not have transparency and shields a light, it is possible to extremely reduce the ratio of the light, which cannot be extracted to the outside of the semiconductor light-emitting device 1 due to shielding of the boding pad electrode 120, to the light emitted from the light-emitting layer 105. Also, the light extraction efficiency is high, and the light extraction property is good.

Further, in the semiconductor light-emitting device 1 of the present embodiment, the junction layer 110 is formed on the bottom surface 109*b* (the upper surface 106*c* of the laminated semiconductor layer 20) and the inner wall 109*d* of the hole portion 109*a* of the transparent electrode 109, and the bonding pad electrode 120 is formed to cover the junction layer 110. Therefore, the high junction strength between the boding pad electrode 120, and the transparent electrode 109 and the laminated semiconductor layer 20 can be obtained by the junction layer 110. Also, the semiconductor light-emitting device 1 of the present embodiment include the p-type electrode 111 with the good junction property.

Further, according to the semiconductor light-emitting device 1 of the present embodiment, since the bonding pad electrode 120 having an slope 119*c*, which is made gradually thinner toward the outside, formed on the outer circumference portion 120*d* is formed to cover the junction layer 110, penetration of external air or moisture into the junction layer 110 can be effectively prevented, and thus the superior anticorrosion property thereof can be obtained.

Figure 11:
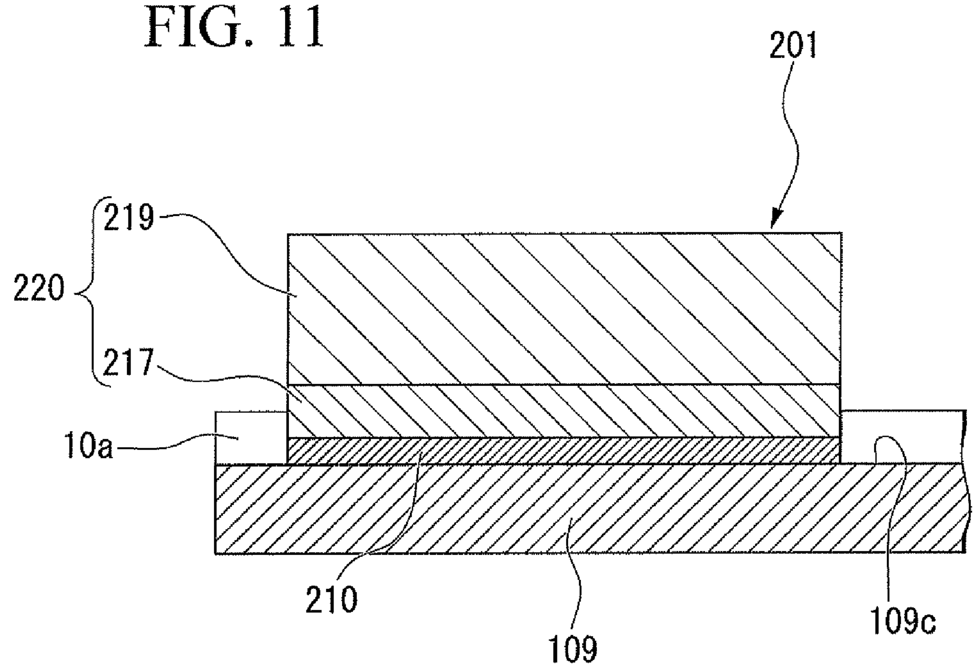
FIG. 11 is a view illustrating effects of a semiconductor light-emitting device of the present invention, and a schematic enlarged cross-sectional view of a p-type electrode.

Here, the effect of the semiconductor light-emitting device of the present embodiment will be described taking the semiconductor light-emitting device 1 having the p-type electrode as illustrated in FIG. 11 as an example. In this case, in FIG. 11, only the p-type electrode provided in the semiconductor light-emitting device is illustrated, and the illustration of the substrate and the laminated semiconductor layer is omitted. In the p-type electrode 201 illustrated in FIG. 11, unlike the semiconductor light-emitting device 1 according to the present embodiment, the edge portion protection film 10*b* is not formed, the hole portion 109*a* is not formed in the transparent electrode 109, and the side surfaces of the junction layer 210 and the metal reflection layer 217 and the bonding layer 219 constituting the bonding pad electrode 220 are formed almost vertical to the upper surface 109*c* of the transparent electrode 109.

In the p-type electrode 201 illustrated in FIG. 11, external air or moisture easily invades between the transparent protective film 10*a* and the metal reflection layer 217 to reach the junction layer 210. If the air or moisture reaches the junction layer 210, the junction layer 210 deteriorates and the life span of the semiconductor light-emitting device is shortened. Particularly, in the case where the junction layer 210 includes Cr, Cr is easily oxidized or hydro-oxidized by the air or moisture having reached the junction layer 210, and thus the junction layer 210 is dissolved and destroyed to cause a serious problem. Further, the oxidation or hydro-oxidation of Cr is accelerated as bias is applied to the semiconductor light-emitting device having the p-type electrode 201 illustrated in FIG. 11, and this may cause the junction layer 210 to be simply dissolved and destroyed.

In contrast, in the semiconductor light-emitting device 1 of the present embodiment, since the bonding pad electrode 120, which is formed to cover the junction layer 110 and has the slope 119*c*, which is made gradually thinner toward the outside, formed on the outer circumference portion 120*d* thereof, is provided, no portion of the junction layer 110 is exposed below the bonding pad electrode 120. Accordingly, according to the semiconductor light-emitting device 1 of the present embodiment, penetration of external air or moisture into the junction layer 110 can be effectively prevented by the semiconductor light-emitting device 1, and thus even in the case where the junction layer 110 is made of Cr, it is possible to obtain the superior anticorrosion property and the superior junction property between the bonding pad electrode 120, and the laminated semiconductor layer 20 and the transparent electrode 109 due to the junction layer 110.

Also, in the semiconductor light-emitting device 1 of the present embodiment, if the junction layer 110 is made of at least one kind of element selected from the group consisting of Al, Ti, V, Cr, Mn, Co, Zn, Ge, Zr, Nb, Mo, Ru, Hf, Ta, W, Re, Rh, Ir, and Ni, and is a thin film of which the maximum thickness is equal to or more than 10 Å and equal to or less than 400 Å, it is possible to even more improve the junction between the bonding pad electrode 120, and the laminated semiconductor layer 20 and the transparent electrode 109.

Further, in the semiconductor light-emitting device 1 of the present embodiment, since the transparent protective film 10*a* is formed to cover an area where the hole portion 109*a* is not formed on the upper surface 109*c* of the transparent electrode 109, and the outer edge portion of the junction layer 110 and the outer edge portion of the bonding pad electrode 120 are arranged on the transparent protective film 10*a*, further more superior anticorrosion and junction properties can be obtained.

Also, in the semiconductor light-emitting device 1 of the present embodiment, the bonding pad electrode 120 includes a metal reflection layer 117 and the bonding layer 119. No portion of the junction film 110 is exposed from the lower part of the metal reflection layer 117, no portion of the metal reflection layer 117 is exposed from the lower part of the bonding layer 119, and the junction layer 110 is doubly covered by the metal reflection layer 117 and the bonding layer 119. Further, in the semiconductor light-emitting device 1 of the present embodiment, the outer edge portion of the bonding pad electrode 120 is arranged on the transparent protective film 10*a*. Accordingly, in the semiconductor light-emitting device 1 of the present embodiment, external air or moisture is unable to invade the junction layer 110 of the semiconductor light-emitting device 1 without passing through the junction surface between the transparent protective film 10*a* and the bonding layer 119 and the junction surface between the transparent protective film 10*a* and the metal reflection layer 117. Accordingly, in the present embodiment, the penetration of the external air or moisture into the junction layer 110 of the semiconductor light-emitting device 1 can be prevented more effectively.

Also, in the semiconductor light-emitting device 1 of the present embodiment, since the edge portion protection film 10*b*, which covers the outer edge portion of the bonding pad electrode 120 and exposes a portion of the bonding pad electrode 120, is formed, further more superior anticorrosion and junction properties can be obtained.

Further, according to the semiconductor light-emitting device 1 of the present embodiment, since the bonding pad electrode 120 having an slope 119*c*, which is made gradually thinner toward the outside, formed on the outer circumference 120*d* is formed to cover the junction layer 110, a contact surface area between the outer circumference portion 120*d* of the bonding pad electrode 120 and the lower surface of the outer circumference portion 120*d* of the bonding pad electrode 120 (in the present embodiment, transparent protection film 10*a*) can be sufficiently secured to obtain superior junction, and the penetration of the external air or moisture into the junction layer 110 through a portion between the outer circumference portion 120*d* of the bonding pad electrode 120 and the lower surface thereof can be effectively prevented to provide superior anticorrosion property.

Also, in the method of manufacturing a semiconductor light-emitting device 1 according to the present embodiment, the step of manufacturing the p-type electrode 111 includes the steps of: forming the transparent electrode 109 on the upper surface 106*c* of the laminated semiconductor layer 20; forming the hole portion 109*a* in the transparent electrode 109, through which the upper surface 106*c* of the laminated semiconductor layer 20 is exposed to the bottom surface 109*b*; forming the junction layer 110, which is made of the material with the property in which the junction resistivity to the laminated semiconductor layer 20 is higher than the junction resistivity to the transparent electrode 109, on the bottom surface 109*b* and the inner wall 109*d* of the hole portion 109*a*; and forming the bonding pad electrode 120 to cover the junction layer 110. Therefore, it is possible to manufacture the semiconductor light-emitting device 1 of the present embodiment which is excellent in the junction property of the p-type electrode 111 and light extraction efficiency.

Also, the method of manufacturing a semiconductor light-emitting device 1 according to the present embodiment includes the steps of forming the hole portion 109*a* by etching the upper surface 109*c* of the transparent electrode 109 exposed from the opening 10*d* of the transparent protection film 10*a*, and forming the junction layer 110 on the bottom surface 109*b* and the inner wall 109*d* of the hole portion 109*a*. Therefore, the junction layer 110 is formed in contact with the inner wall 109*d* of the hole portion 109*a* that is exposed from the transparent electrode 109 by forming the hole portion 109*a*. By forming the hole portion 109*a*, the inner wall 109*d* of the hole portion 109*a* that is exposed from the transparent electrode 109 has superior adhesion to the junction layer 110 in comparison to the upper surface 109*c* of the transparent electrode 109, and thus according to the manufacturing method of the present embodiment, the p-type electrode 111 having superior adhesion with the junction layer 110 can be obtained in comparison to the case of forming the junction layer 110 on the upper surface 109*c* of the transparent electrode 109.

Embodiment 2 Semiconductor Light-Emitting Device

Figure 7:
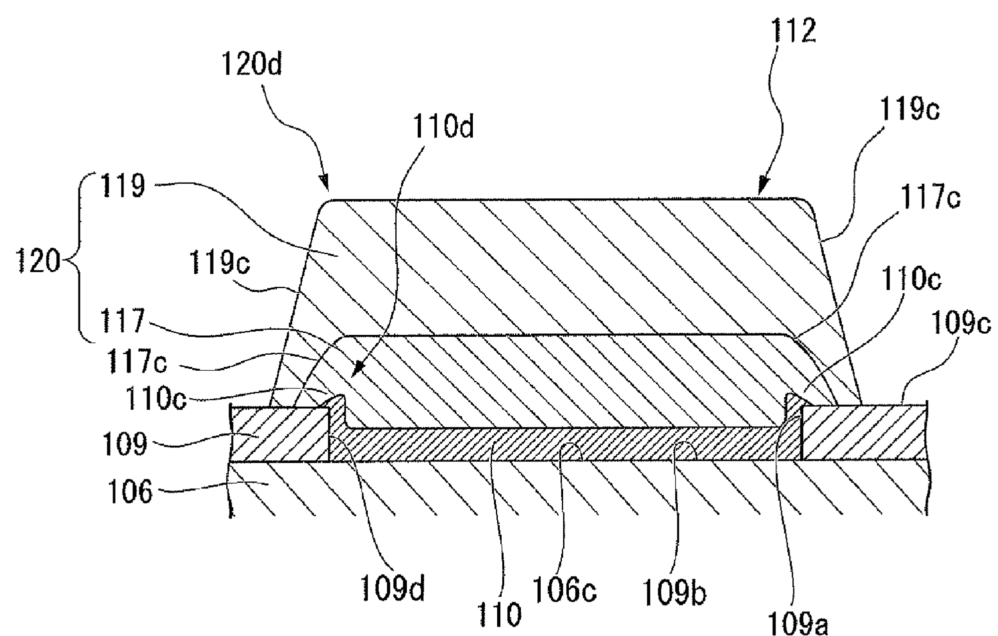
FIG. 7 is a view illustrating another example of a semiconductor light-emitting device according to the present invention, and a schematic enlarged cross-sectional view of a p-type electrode constituting the semiconductor light-emitting device.

FIG. 7 is a view illustrating another example of a semiconductor light-emitting device according to the present invention, and is a schematic enlarged cross-sectional view illustrating a p-type electrode that constitutes the semiconductor light-emitting device. The semiconductor light-emitting device of the present embodiment as illustrated in FIG. 7 has the same configuration as that of the semiconductor light-emitting device 1 as illustrated in FIG. 1 except that the transparent protective film 10*a* and the edge portion protection film 10*b* are not formed in the present embodiment. The configuration except those is the same as the semiconductor light-emitting device 1 illustrated in FIG. 1. Accordingly, the same reference numerals are given to the same members as those according to Embodiment 1, and the explanation thereof will be omitted.

Also, the p-type electrode 112 that constitutes the semiconductor light-emitting device of the present embodiment can be formed in the same manner as the p-type electrode 111 as illustrated in FIG. 1 except that the transparent protective film 10*a* and the edge portion protection film 10*b* are not formed in the present embodiment.

Even though the transparent protection film 10*a* and the edge portion protection film 10*b* are not prepared as in the semiconductor light-emitting device of the present embodiment illustrated in FIG. 7, the p-type electrode 112 includes: the transparent electrode 109 containing the hole portion 109*a*, through which the upper surface 106*c* of the laminated semiconductor layer 20 is exposed, on the bottom surface 109*b*; the junction layer 110 formed on the bottom surface 109*b* and the inner wall 109*d* of the hole portion 109*a*; and the bonding pad electrode 120 formed to cover the junction layer 110. Also, the junction resistivity between the junction layer 110 and the laminated semiconductor layer 20 is higher than the junction resistivity between the junction layer 110 and the transparent electrode 109. Therefore, the current from the boding pad electrode 120 is mainly diffused in the in-plane direction of the transparent 109 from the inner wall 109*d* of the hole portion 109*a* of the transparent electrode 109 through the junction layer 110, and is supplied on the upper surface of the laminated semiconductor layer 20. The amount of the current supplied through the transparent electrode 109 among the current supplied to the laminated semiconductor 20 is larger than the amount of the current directly supplied from the junction layer 110 that contacts the laminated semiconductor layer 20.

Therefore, even in the semiconductor light-emitting device of the present embodiment, even though the bonding pad electrode 120 does not have transparency and shields a light, it is possible to extremely reduce the ratio of the light, which cannot be extracted to the outside of the semiconductor light-emitting device 1 due to shielding of the boding pad electrode 120, to the light emitted from the light-emitting layer 105. Also, the light extraction efficiency is high, and the light extraction property is good.

Further, even in the semiconductor light-emitting device of the present embodiment, due to the junction layer 110, it is possible to obtain the sufficiently high junction strength between the bonding pad electrode 120, and the transparent electrode 109 and the laminated semiconductor layer 20.

Thus, the semiconductor light-emitting device includes the p-type electrode 111 with the good junction property.

Further, even in the semiconductor light-emitting device of the present embodiment, the bonding pad electrode 120 having the slope 119*c*, which is made gradually thinner toward the outside and is formed in the outer circumference portion 120*d*, is formed to cover the junction layer 110, and thus the penetration of the external air or moisture into the junction layer 110 can be effectively prevented, and thus superior anticorrosion property is obtained.

Embodiment 3 Semiconductor Light-Emitting Device

Figure 8:
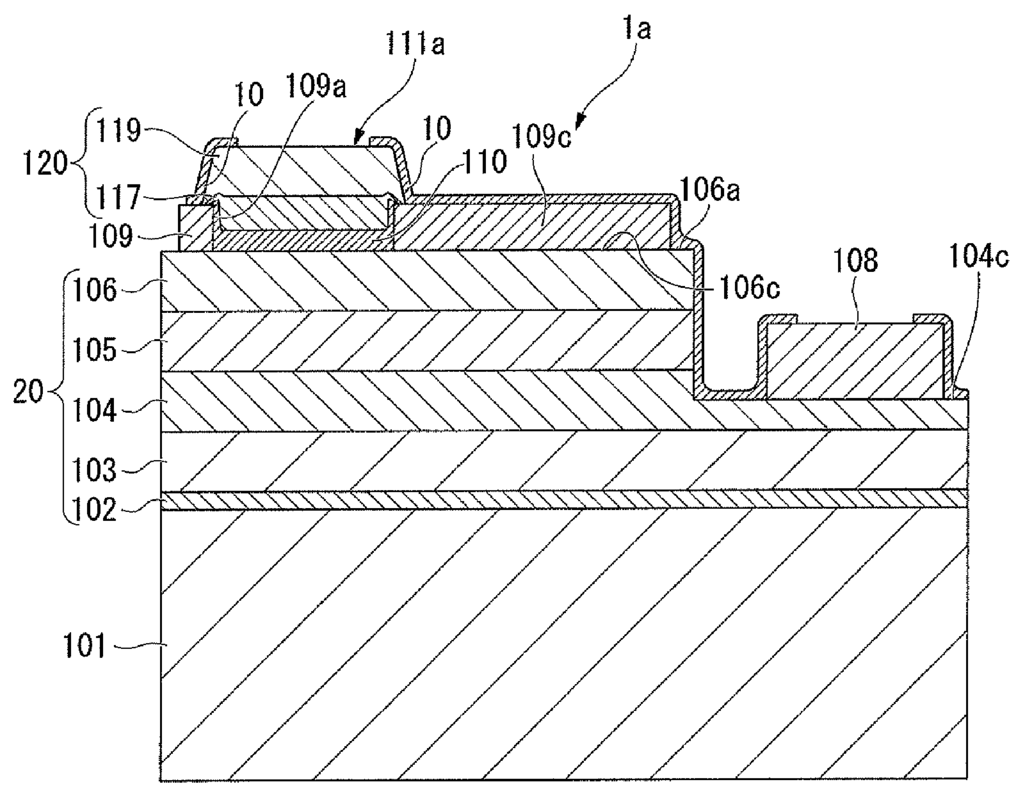
FIG. 8 is a view illustrating another example of a semiconductor light-emitting device according to the present invention, and a schematic cross-sectional view of the semiconductor light-emitting device.

FIG. 8 is a view illustrating another example of a semiconductor light-emitting device according to the present invention, and is a schematic cross-sectional view illustrating a semiconductor light-emitting device according to the present invention. The semiconductor light-emitting device 1*a* of the present embodiment as illustrated in FIG. 8 has the same configuration as that of the semiconductor light-emitting device 1 as illustrated in FIG. 1 except that the transparent protective film 10*a* is not formed, and as planarly viewed, an upper surface protection film 10 is installed on the entire surface of the upper surface 109*c* of the transparent electrode 109 except for the area that exposes the center portion of the bonding pad electrode 120 in the present embodiment. The configuration except those is the same as the semiconductor light-emitting device 1 illustrated in FIG. 1. Accordingly, the same reference numerals are given to the same members as those according to Embodiment 1, and the explanation thereof will be omitted.

The upper surface protection film 10 may be made of the same material as the transparent protective film 10*a* with the same thickness according to the semiconductor light-emitting device 1 as illustrated in FIG. 1.

In order to manufacture the semiconductor light-emitting device 1*a* as illustrated in FIG. 8, the n-type electrode 108 is formed after the laminated semiconductor layer 20 is formed in the same manner as the semiconductor light-emitting device 1 as illustrated in FIG. 1.

Then, as described below, the p-type electrode 111*a* is manufactured. FIG. 9A to FIG. 9E are the views illustrating a step of manufacturing the p-type electrode, and is an enlarged cross-sectional view illustrating only a portion of the area in which the p-type electrode 111*a* is manufactured.

Figure 9A:
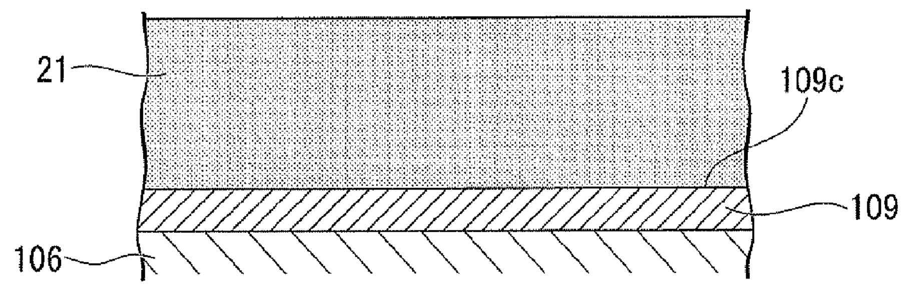
FIG. 9A is a view illustrating a step of manufacturing a p-type electrode, and an enlarged cross-sectional view illustrating only a portion of an area in which the p-type electrode is manufactured.

As illustrated in FIG. 9A, in order to manufacture the p-type electrode 111*a* of the present embodiment, the transparent electrode 109 is first formed on the p-type semiconductor layer 106 in the same manner as the semiconductor light-emitting device 1 as illustrated in FIG. 1.

Figure 9B:
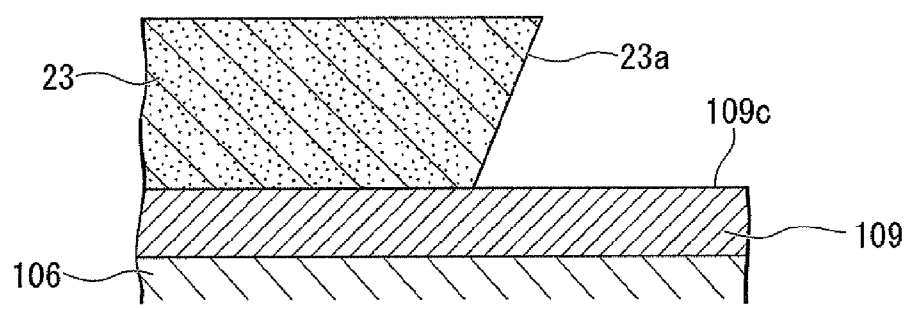
FIG. 9B is a view illustrating a step of manufacturing a p-type electrode, and an enlarged cross-sectional view illustrating only a portion of an area in which the p-type electrode is manufactured.

Then, as illustrated in FIG. 9A, a resist 21 is coated on the transparent protective film 10*a* to be dried, and a reverse-tapered mask 23 illustrated in FIG. 9B, which has an opening 23*a* that is in the form of an inner wall of which the cross-sectional area is gradually widened toward the bottom surface, is formed on the upper surface 109*c* of the transparent electrode 109 in the same manner as the semiconductor light-emitting device 1 as illustrated in FIG. 1.

Figure 9C:
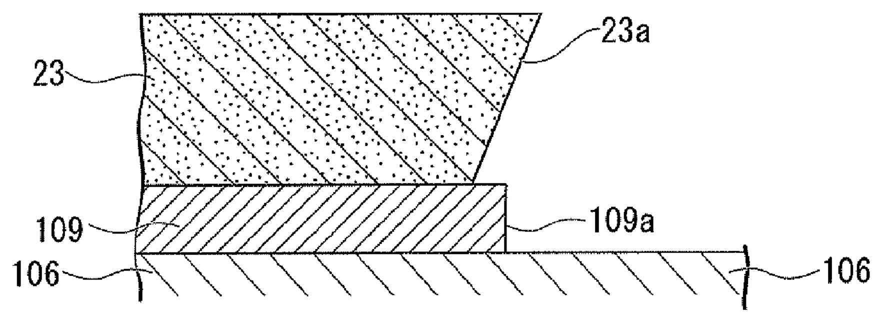
FIG. 9C is a view illustrating a step of manufacturing a p-type electrode, and an enlarged cross-sectional view illustrating only a portion of an area in which the p-type electrode is manufactured.

Then, a hole portion 109*a* is formed in the transparent electrode 109, as illustrated in FIG. 9C, by etching the transparent electrode 109 that is exposed from the opening 23*a* of the mask 23 as illustrated in FIG. 9B in the same manner as the semiconductor light-emitting device 1 as illustrated in FIG. 1.

Figure 9D:
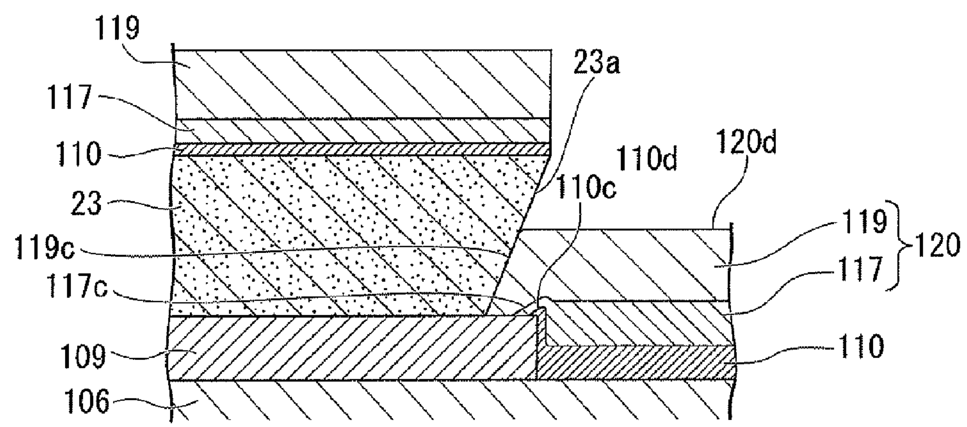
FIG. 9D is a view illustrating a step of manufacturing a p-type electrode, and an enlarged cross-sectional view illustrating only a portion of an area in which the p-type electrode is manufactured.
Figure 9E:
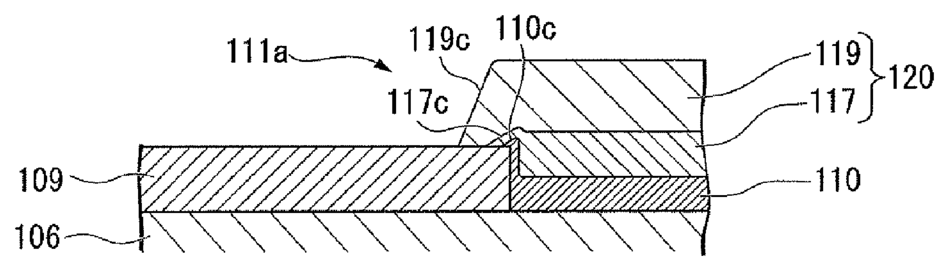
FIG. 9E is a view illustrating a step of manufacturing a p-type electrode, and an enlarged cross-sectional view illustrating only a portion of an area in which the p-type electrode is manufactured.

Then, as illustrated in FIG. 9D, in the same manner as the semiconductor light-emitting device 1 as illustrated in FIG. 1, a junction layer 110, a metal reflection layer 117, and a bonding layer 119 are formed. Thereafter, in the same manner as the semiconductor light-emitting device 1 as illustrated in FIG. 1, the mask 23 is peeled off. Accordingly, as illustrated in FIG. 9E, a bonding pad electrode 120 including the metal reflection layer 117 and the bonding layer 119 is formed. Even in the present embodiment, in the same manner as the semiconductor light-emitting device 1 as illustrated in FIG. 1, slopes 110*c*, 117*c*, and 119*c*, which are made gradually thinner toward the outside, are formed on the outer circumference portions of the junction layer 110, the metal reflection layer 117, and the bonding layer 119.

Next, using a known method in the related art, as seen from a plane, the upper surface protection film 10 is formed on the entire surface of the upper surface 109*c* of the transparent electrode 109, except for the area that exposes the center portion of the bonding pad electrode 120. By doing this, a semiconductor light-emitting device 1*a* having the p-type electrode 111*a* as illustrated in FIG. 8 is formed.

Even in the semiconductor light-emitting device 1*a* of the present embodiment, in the same manner as the semiconductor light-emitting device 1 as illustrated in FIG. 1, the light extraction efficiency is high, the light extraction property is good, and the junction and anticorrosion properties are good.

Also, according to the semiconductor light-emitting device 1*a* of the present embodiment, as seen from a plane, since the upper surface protection film 10 is formed on the entire surface of the upper surface 109*c* of the transparent electrode 109, except for the area that exposes the center portion of the bonding pad electrode 120, further excellent anticorrosion and junction properties can be obtained.

Embodiment 4 Lamp

Figure 10:
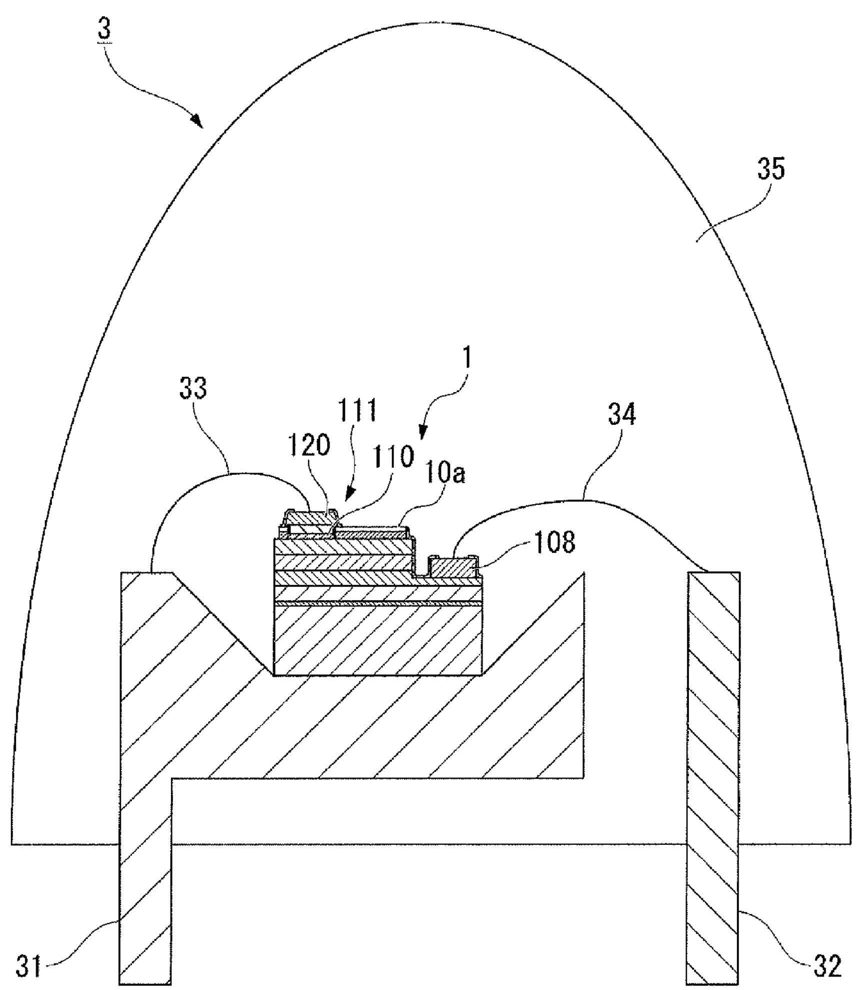
FIG. 10 is a schematic cross-sectional view illustrating an example of a lamp of the present invention.

FIG. 10 is a schematic cross-sectional view illustrating an example of a lamp according to the present invention. As illustrated in FIG. 10, the lamp 3 of the present embodiment is in the form of a shell, and the semiconductor light-emitting device 1 according to the present invention as illustrated in FIG. 1 is built therein as the semiconductor light-emitting device. In this case, the lamp 3, for example, is configured by combining the semiconductor light-emitting device 1 and phosphors, and has a configuration that is known to those of ordinary skill in the art which is configured by a means that is known to those of ordinary skill in the art. Also, by combining the semiconductor light-emitting device 1 with phosphors, it is known that the light-emitting color can be changed, and it is possible to adopt such technology even in the lamp according to an embodiment of the present invention without any limitation.

As illustrated in FIG. 10, the lamp 3 of the present embodiment includes one frame 31 which is bonded by a wire 33 to the bonding pad electrode 120 of the p-type electrode 111 of the semiconductor light-emitting device 1, the other frame 32 which is bonded by a wire 34 to the n-type electrode 108 (bonding pad) of the semiconductor light-emitting device 1, and a mold 35 made of transparent resin that is formed around the neighborhood of the semiconductor light-emitting device 1.

Also, the lamp 3 according to the present embodiment is provided with the semiconductor light-emitting device 1 as illustrated in FIG. 1 which is excellent in the light extraction efficiency and has the electrode having superior junction and anticorrosion properties as a semiconductor light-emitting device. Therefore, the lamp 3 with superior anticorrosion property and light emission efficiency can be manufactured with good yield.

The lamp 3 according to the present embodiment may be used in any type for any purpose, such as a shell type for general use, a side view type for a portable backlight, a top view type for use in a displayer, and the like.

Also, since the lamp 3 manufactured from the semiconductor light-emitting device according to the present invention has superior effect as described above, an electronic appliance incorporated with the lamp manufactured by this technique, such as a backlight, portable phone, display, various kinds of panels, computer, game machine, illumination, or the like, and a mechanical device such as a vehicle incorporated with the electronic appliance can provide high reliability as the product in use. Particularly, in an appliance that drives a battery, such as a backlight, portable phone, display, game machine, illumination, or the like, a product provided with a light-emitting device having high reliability can be preferably provided.

EXAMPLES

Hereinafter, the present invention will be described in detail based on examples. However, the present invention is not limited to such examples.

Example 1

Production of Semiconductor Light-Emitting Device

A semiconductor light-emitting device made of gallium nitride-based compound semiconductor as illustrated FIG. 1 to FIG. 3, in which the p-type electrode 111 (the transparent electrode 109, and the junction layer 110, and the bonding pad electrode 120 (the metal reflection layer 117, the barrier layer, and the bonding layer 119)) and the n-type electrode 108 had the configurations shown in Tables 1 and 2, was manufactured as follows.

TABLE 1

| | P-Type Electrode | | | | | | | | | | |
|---|---|---|---|---|---|---|---|---|---|---|---|
| | | | | | Bonding Pad Electrode | | | | | | |
| | Transparent Electrode | | Junction Layer | | Metal Reflection Layer | | Barrier Layer | | Bonding Layer | | |
| | Material | Thickness (nm) | Material | Thickness (nm) | Material | Thickness (nm) | Material | Thickness (nm) | Material | Thickness (nm) | N-Type Electrode |
| Example 1 | IZO | 250 | Cr | 10 | Pt | 100 | — | — | Au | 1100 | Ti/Pt/Au |
| Example 2 | IZO | 250 | Cr | 10 | Pt | 100 | — | — | Au | 1100 | Same as Configuration of Junction Layer and Bonding Pad Electrode of P-Type Electrode |
| Example 3 | ITO | 200 | Cr | 2 | Rh | 200 | Ti | 80 | Au | 200 | Same as above |
| Example 4 | IZO | 200 | Cr | 2 | Al | 200 | Ti | 80 | Au | 200 | Same as above |
| Example 5 | IZO | 200 | Cr | 2 | Ag | 200 | Ti | 80 | Au | 200 | Same as above |
| Example 6 | IZO | 200 | Cr | 2 | Rh | 200 | Ti | 80 | Au | 200 | Same as above |
| Example 7 | IZO | 200 | Ni | 2 | Al | 200 | Ti | 80 | Au | 200 | Same as above |
| Example 8 | IZO | 200 | Co | 2 | Al | 200 | Ti | 80 | Au | 200 | Same as above |
| Example 9 | IZO | 200 | Cr | 1 | Al | 200 | Ti | 80 | Au | 200 | Same as above |
| Example 10 | IZO | 200 | Cr | 5 | Al | 200 | Ti | 80 | Au | 200 | Same as above |

TABLE 2

| | P-Type Electrode | | | | | | | | | | |
|---|---|---|---|---|---|---|---|---|---|---|---|
| | | | | | Bonding Pad Electrode | | | | | | |
| | Transparent Electrode | | Junction Layer | | Metal Reflection Layer | | Barrier Layer | | Bonding Layer | | |
| | Material | Thickness (nm) | Material | Thickness (nm) | Material | Thickness (nm) | Material | Thickness (nm) | Material | Thickness (nm) | N-Type Electrode |
| Example 11 | IZO | 250 | Cr | 40 | Pt | 100 | — | — | Au | 1100 | Same as above |
| Example 12 | IZO | 200 | Ti | 10 | Rh | 100 | — | — | Au | 1100 | Same as above |
| Example 13 | IZO | 200 | Ti | 10 | Pt | 100 | — | — | Au | 1100 | Same as above |
| Example 14 | IZO | 200 | Ti | 10 | Ir | 100 | — | — | Au | 1100 | Same as above |
| Example 15 | ITO | 200 | Ti | 2 | Pt | 200 | — | — | Au | 550 | Same as above |
| Example 16 | ITO | 200 | Ti | 2 | Ir | 200 | — | — | Au | 550 | Same as above |
| Example 17 | ITO | 200 | Ni | 40 | — | — | — | — | Au | 1100 | Same as above |
| Example 18 | ITO | 200 | Ni | 40 | Pt | 200 | — | — | Au | 550 | Same as above |
| Comparative Example 1 | IZO | 250 | Cr | 10 | Pt | 200 | — | — | Au | 1100 | Ti/Pt/Au |

[Formation of Laminated Semiconductor Layer]

First, an ground layer 103 made of undoped GaN with a thickness of 8 μm was formed on a substrate 101 made of sapphire via a buffer layer 102 made of AlN. Next, an n-contact layer **104*a* made of Si-doped n-type GaN with a thickness of 2 μm and an n-type clad layer 104*b* made of n-type $In_{0.1}Ga_{0.9}N$ with a thickness of 250 nm were formed. Thereafter, a Si-doped GaN barrier layer with a thickness of 16 nm and an $In_{0.2}Ga_{0.8}N$ well layer with a thickness of 2.5 nm were laminated five times, and lastly, a light-emitting layer 105 of a multiple quantum well structure, in which the barrier layer was installed, was formed. Further, a p-clad layer 106*a* made of Mg-doped p-type $Al_{0.07}Ga_{0.93}N$ with a thickness of 10 nm and a p-contact layer 106*b*** made of Mg-doped p-type GaN with a thickness of 150 nm were formed in order.

At that time, the formation of the laminated semiconductor layer 20 was performed by a MOCVD method on well-known typical conditions in the corresponding technical field.

[Formation of Electrode]

After the laminated semiconductor layer 20 was formed as described above, a portion of the n-contact layer **104*a* was exposed by patterning the laminated semiconductor layer 20 by a photolithography method and etching a portion of the laminated semiconductor layer 20 of a predetermined area. Next, an n-type electrode 108 made of Ti/Pt/Au in order was formed on the exposed surface 104*c* of the n-contact layer 104*a*** by a sputtering method.

Thereafter, as described below, a p-type electrode 111 was formed. First, a transparent electrode 109 made of IZO with a thickness of 250 nm was formed on the p-type GaN contact layer **106*b*, and a transparent protective film 10*a* made of $SiO_2$ with a thickness of 100 nm was formed on the transparent electrode 109**.

Next, using AZ5200NJ (product name: product of AZ Electronic Materials) as an image reversion type photoresist, a reverse-tapered mask 23 having an opening **23*a* that is in the form of an inner wall of which the cross-sectional area was gradually widened toward the bottom surface, was formed on the upper surface of the transparent electrode 109 on which the transparent protective film 10*a*** was formed.

Then, the transparent protective film **10*a* that is exposed from the opening 23*a* of the mask 23 was removed by using RIE (Reactive Ion Etching) in a direction vertical to the upper surface 109*c* of the transparent electrode 109, so as to form an opening 10*d* and to expose the upper surface 109*c* of the transparent electrode 109 from the opening 10*d***.

Next, a hole portion **109*a* was formed by dry-etching the transparent electrode 109 that is exposed form the opening 23*a* of the mask 23**. Thereafter, the heat-treatment was performed at temperature of 650° C. in nitrogen atmosphere to crystallize the IZO layer in an amorphous state.

Next, by the sputtering method, the junction layer 110 made of Cr was formed with a maximum thickness of 10 nm to cover the bottom surface **109*b* and the inner wall 109*d* of the hole portion 109*a* of the transparent electrode 109. Next, by the sputtering method, a metal reflection layer 117 made of Pt with a maximum thickness of 100 nm which covers the junction layer 110 and has an slope 117*c*, which is made gradually thinner toward the outside, formed on the outer circumference thereof was formed. Then, by the sputtering method, the bonding layer 119 made of Au with a maximum thickness of 1100 nm, of which the shape of the outer circumference was formed along the inner wall shape of the opening 23*a* of the mask 23, which covered the metal reflection layer 117, and had an slope 119*c*, which was made gradually thinner toward the outside, formed on the outer circumference portion 120*d*, was formed. Accordingly, the bonding pad electrode 120 including the metal reflection layer 117 and the bonding layer 119** was formed.

Thereafter, by soaking the resist in a resist peel-off solution, the mask 23 was peeled off. Next, as planarly viewed, the edge portion protection film **10*b*, which was made of $SiO_2$ with a width of 5 μm and with a maximum thickness of 250 nm, covered the outer edge portion of the bonding pad electrode 120 through a portion that is a juncture between the outer edge portion (contour-line) of the bonding pad electrode 120 and the transparent protective film 10*a*, and was roughly in the form of a donut that exposes the center portion of the bonding pad electrode 120. By doing this, a semiconductor light-emitting device 1 of Example 1 having the p-type electrode 111 as illustrated in FIG. 1 to FIG. 3** was obtained.

Examples 2-18

Semiconductor light-emitting devices of Examples 2-18, which were the same as the semiconductor light-emitting device 1 of Example 1 except that the p-type electrode (the transparent electrode, the junction layer, and the bonding pad electrode (the metal reflection layer, the barrier layer, and the bonding layer)) and the n-type electrode were configured as shown in Tables 1 and 2, were manufactured.

Comparative Example 1

A semiconductor light-emitting device illustrated in FIG. 11 was manufactured, which was the same as the semiconductor light-emitting device 1 of Example 1, except that the edge portion protection film **10*b* was not formed; the hole portion 109*a* is not formed in the transparent electrode 109; and the side surfaces of the metal reflection layer 217 and the boding layer 219, which constituted the junction layer 210 and the bonding pad electrode 220, were formed almost vertical to the upper surface 109*c* of the transparent electrode 109**.

<Evaluation of Semiconductor Light-Emitting Device>

With respect to the semiconductor light-emitting devices of Examples 1-18 and Comparative Example 1, a forward voltage was measured through conduction by a probe with an applied current value of 20 mA. The results are shown in Table 3.

As shown in Table 3, the forward voltage in Examples 1-18 was 3.0 V or 3.1 V, and the forward voltage in Comparative Example 1 was 3.0 V.

TABLE 3

| | Forward Voltage (V) | Light Emission Output (mW) | Reflection Ratio of Bonding Pad Electrode (%) | Number of Bonding Inferiorities (among 100,000 chips) | Number of Inferiorities in Test at High Temperature and Humidity (among 100 chips) | Anticorrosion Test |
|---|---|---|---|---|---|---|
| Example 1 | 3.0 | 20 | 80 | 0 | 2 | Good |
| Example 2 | 3.0 | 21 | 80 | 2 | 5 | Good |

TABLE 3-continued

| | Forward Voltage (V) | Light Emission Output (mW) | Reflection Ratio of Bonding Pad Electrode (%) | Number of Bonding Inferiorities (among 100,000 chips) | Number of Inferiorities in Test at High Temperature and Humidity (among 100 chips) | Anticorrosion Test |
|---|---|---|---|---|---|---|
| Example 3 | 3.0 | 22 | 85 | 0 | 0 | Good |
| Example 4 | 3.1 | 22 | 85 | 1 | 5 | Good |
| Example 5 | 3.1 | 22.5 | 85 | 2 | 5 | Good |
| Example 6 | 3.1 | 22 | 85 | 0 | 0 | Good |
| Example 7 | 3.0 | 22 | 85 | 2 | 6 | Good |
| Example 8 | 3.0 | 22 | 85 | 3 | 7 | Good |
| Example 9 | 3.0 | 23 | 90 | 5 | 10 | Good |
| Example 10 | 3.0 | 21 | 75 | 0 | 2 | Good |
| Example 11 | 3.0 | 20.5 | 70 | 0 | 0 | Good |
| Example 12 | 3.0 | 20.5 | 70 | 0 | 0 | Good |
| Example 13 | 3.0 | 20.5 | 70 | 0 | 0 | Good |
| Example 14 | 3.0 | 20.5 | 70 | 0 | 0 | Good |
| Example 15 | 3.0 | 21 | 75 | 0 | 0 | Good |
| Example 16 | 3.0 | 21 | 75 | 0 | 0 | Good |
| Example 17 | 3.0 | 19 | 55 | 0 | 0 | Good |
| Example 18 | 3.0 | 20.5 | 70 | 0 | 0 | Good |
| Comparative Example 1 | 3.0 | 21 | 80 | 50 | 65 | Bad |

Thereafter, the semiconductor light-emitting devices of Examples 1-18 and Comparative Example 1 were mounted in the TO-18 can package, and the light emission output at the applied current of 20 mA was measured by a tester. The results of measurement are shown in Table 3.

As shown in Table 3, the light emission outputs of Examples 1-18 were within the range of 19.5 to 23 mW, and the light emission output of Comparative Example 1 was 21 mW.

The light emission distributions on the light-emitting surfaces were examined in Example 1-18 and Comparative Example 1. As a result, the uniform light emissions were confirmed in Example 1-18. In contrast, in Comparative Example 1, the light emission was confirmed only on the light-emitting layer that was positioned in the vicinity of the p-type electrode.

Further, in the Examples 1-18 and the Comparative Example 1, the reflection ratio of the produced bonding pad electrode was measured. The measurement of the reflection ratio was performed in a wavelength area of 460 nm using a spectrophotometer with respect to the same thin film as the bonding pad electrode formed using a glass dummy substrate put into the chamber during the formation of the bonding pad electrode. The results of measurement are shown in Table 3.

Also, boding test was performed with respect to the semiconductor light-emitting devices (chips) of Examples 1-18 and Comparative Example 1. The results are shown in Table 3.

As illustrated in Table 3, in Examples 1, 3, 6, and 10-18, there was no chip in which the pad was peeled off (the number of bonding inferiorities) among 100,000 chips. Also, in other Examples, the number of bonding inferiorities was 5 or less, which was very small. In contrast, in Comparative Example 1, the number of bonding inferiorities was 50 among 100,000 chips.

<Chip Test in High Temperature and Humidity Conditions>

The semiconductor light-emitting devices (chip) of Examples 1-18 and Comparative Example 1 were put into high-temperature high-humidity tester (ISUZU Seisakusho, Co., Ltd., μ-SERIES), and a light emission test (the amount of current passing through the chip was 5 mA, for 2000 hours) was made with respect to 100 chips under the environment of a temperature of 85° C. and relative humidity of 85RH %. The test results are shown in Table 3.

As shown in Table 3, the number of inferiorities was 0 in Examples 3, 6, and 11-18. Also, in other Examples, the number of inferiorities was 10 or less, which is quite small. In contrast, in Comparative Example 1, the number of inferiorities was 65.

<Anticorrosion Test>

In a state where the semiconductor light-emitting device emitted light under the conditions of the applied current value of 20 mA and the forward voltage of 3.0 V to 3.1 V, the semiconductor light-emitting devices in Examples 1-18 and Comparative Example 1 were sunk under water in a water tank.

In Examples 1-18, the semiconductor light-emitting devices were kept in this state for 10 minutes, was pulled out of the water, and then the light emission characteristic was measured again. As a result, in Examples 1-18, the light emission characteristics after the semiconductor light-emitting device was sunk under water in the water tank was almost not changed in comparison to that measured before the semiconductor light-emitting device was sunk under water.

In contrast, in Comparative Example 1, the light emission was kept only for several seconds in a state where the semiconductor light-emitting device is sunk under water in the water tank, and no further light was emitted thereafter.

INDUSTRIAL APPLICABILITY

The present invention relates to a semiconductor light-emitting device, a manufacturing method thereof, and a lamp, and can be used in the industry that manufactures and uses the semiconductor light-emitting device having the electrode improved in junction and anticorrosion properties, the manufacturing method thereof, and the lamp.

REFERENCE SIGNS LIST

1, 1*a*: Semiconductor Light-Emitting Device
3: Lamp

10*a*: Transparent Protection Film
10*b*: Edge Portion Protection Film
10*c*: End Portion
10*d*: Opening
20: Laminated Semiconductor Layer
21: Resist
22: Soluble Resist
23, 25: Mask
23*a*: Opening
31, 32: Frame
33, 34: Wire
35: Mold
101: Substrate
102: Buffer Layer
103: Ground Layer
104: N-Type Semiconductor Layer
104*a*: N-Contact Layer
104*b*: N-Clad Layer
104*c*: Exposed Surface
105: Light-Emitting Layer
105*a*: Barrier Layer
105*b*: Well Layer
106: P-Type Semiconductor Layer
106*a*: P-Clad Layer
106*b*: P-Contact Layer
106*c*: Upper Surface
108: N-Type Electrode (Second Electrode)
109: Transparent Electrode
109*a*: Hole Portion
109*b*: Bottom Surface
109*c*: Upper Surface
109*d*: Inner wall
110: Junction Layer
110*c*: Slope
110*d*: Outer Circumference Portion
111, 112: P-Type Electrode (First Electrode)
117: Metal Reflection Layer
117*c*: Slope
119: Bonding Layer
119*c*: Slope
120: Bonding Pad Electrode
120*d*: Outer Circumference Portion

The invention claimed is:

1. A semiconductor light-emitting device comprising:

a substrate;

a laminated semiconductor layer containing a light-emitting layer, which is formed on the substrate;

a first electrode formed on the upper surface of the laminated semiconductor layer; and a second electrode formed on an exposed surface that is formed by partially cutting the laminated semiconductor layer, wherein the first electrode includes a transparent electrode containing a hole portion through which the upper surface of the laminated semiconductor layer is exposed, a junction layer formed on a bottom surface and an inner wall of the hole portion, and a bonding pad electrode formed directly over the junction layer wherein the bonding pad electrode completely covers the junction layer, a junction resistivity between the laminated semiconductor layer and the junction layer is higher than a junction resistivity between the transparent electrode and the junction layer;

the bonding pad electrode is comprised of a metal reflection layer formed directly over the junction layer wherein the metal reflection layer completely covers the junction layer, and a bonding layer formed directly over the metal reflection layer wherein the bonding layer completely covers the metal reflection layer, and the metal reflection layer is made of any one selected from the group consisting of Ag, Al, Ru, Rh, Pd, Os, Ir, Pt, and Ti or an alloy comprising any one of these metals.

2. The semiconductor light-emitting device according to claim 1, wherein the junction layer is made of at least one kind of element selected from the group consisting of Al, Ti, V, Cr, Mn, Co, Zn, Ge, Zr, Nb, Mo, Ru, Hf, Ta, W, Re, Rh, Ir, and Ni, and is a thin film whose maximum thickness is within a range from 10 Å or more to 400 Å or less.

3. The semiconductor light-emitting device according to claim 1, wherein the bonding layer is made of Au, Al, or an alloy comprising any one of these metals.

4. The semiconductor light-emitting device according to claim 1, wherein the transparent electrode is made of a transparent conductive material selected from the group consisting of zinc sulfide, chromium sulfide, and a conductive oxide comprising any one kind selected from the group consisting of In, Zn, Al, Ga, Ti, Bi, Mg, W, Ce, Sn, and Ni.

5. The semiconductor light-emitting device according to claim 1, wherein the laminated semiconductor layer is mainly comprised of a gallium nitride semiconductor.

6. The semiconductor light-emitting device according to claim 1, wherein the laminated semiconductor layer is formed by laminating in order an n-type semiconductor layer, the light-emitting layer, and a p-type semiconductor layer on the substrate, and the light-emitting layer has a multiple quantum well structure.

7. A lamp comprising:

the semiconductor light-emitting device according to claim 1;

a first frame on which the semiconductor light-emitting device is arranged and which is wire-bonded with the first electrode of the semiconductor light-emitting device;

a second frame which is wire-bonded with the second electrode of the semiconductor light-emitting device; and a mold formed around the semiconductor light-emitting device.

8. A method of manufacturing a semiconductor light-emitting device which comprises a substrate; a laminated semiconductor layer containing a light-emitting layer, which is formed on the substrate; a first electrode formed on the upper surface of the laminated semiconductor layer; and a second electrode formed on an exposed surface that is formed by partially cutting the laminated semiconductor layer, the method comprising a first electrode formation step which comprises the steps of:

forming a transparent electrode on the upper surface of the laminated semiconductor layer;

forming a hole portion of the transparent electrode, through which the upper surface of the laminated semiconductor layer is exposed;

forming a junction layer on a bottom surface and an inner wall of the hole portion; and forming a bonding pad electrode directly over the junction layer wherein the bonding pad electrode completely covers the junction layer, wherein the bonding pad electrode is comprised of a metal reflection layer formed directly over the junction layer wherein the metal reflection layer completely covers the junction layer, and a bonding layer formed directly over the metal reflection layer wherein the bonding layer completely covers the metal reflection layer, and the metal reflection layer is made of any one selected from the group consisting of Ag, Al, Ru, Rh, Pd, Os, Ir, Pt, and Ti or an alloy comprising any one of these metals.

9. An electronic appliance incorporated with the lamp according to claim 7.

10. A mechanical device incorporated with the electronic appliance according to claim 9.

11. The semiconductor light-emitting device according to claim 1, wherein the bonding pad electrode is formed directly over the junction layer wherein the bonding pad electrode completely covers the junction layer and has a slope which is made gradually thinner toward the outside.

12. The semiconductor light-emitting device according to claim 1, further comprising an edge portion protection film formed to cover the bonding pad electrode.

13. The semiconductor light-emitting device according to claim 1, wherein the junction layer is in direct contact with the bottom surface and the inner wall of the hole portion.

14. The semiconductor light-emitting device according to claim 1, wherein the junction layer is in interfacial contact with the entire upper surface of the laminated semiconductor layer that is exposed through the hole portion.

* * * * *